(12) United States Patent
Sills et al.

(10) Patent No.: US 11,211,292 B2
(45) Date of Patent: Dec. 28, 2021

(54) ASSEMBLIES CONTAINING PMOS DECKS VERTICALLY-INTEGRATED WITH NMOS DECKS, AND METHODS OF FORMING INTEGRATED ASSEMBLIES

(71) Applicant: Micron Technology, Inc., Boise, ID (US)

(72) Inventors: Scott E. Sills, Boise, ID (US); Kurt D. Beigel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 137 days.

(21) Appl. No.: 16/402,570

(22) Filed: May 3, 2019

(65) Prior Publication Data
US 2019/0259663 A1    Aug. 22, 2019

Related U.S. Application Data

(62) Division of application No. 15/857,974, filed on Dec. 29, 2017, now Pat. No. 10,410,925.

(51) Int. Cl.
*H01L 21/82* (2006.01)
*H01L 21/822* (2006.01)
(Continued)

(52) U.S. Cl.
CPC .. *H01L 21/8221* (2013.01); *H01L 21/823871* (2013.01); *H01L 21/823885* (2013.01);
(Continued)

(58) Field of Classification Search
CPC ............. H01L 21/8221; H01L 27/0688; H01L 21/823885; H01L 21/84; H01L 27/1207;
(Continued)

(56) References Cited

U.S. PATENT DOCUMENTS

| 4,657,628 A | * | 4/1987 | Holloway | ............. | H01L 21/306 |
| | | | | | 156/643 |
| 9,419,003 B1 | * | 8/2016 | Colinge | .......... | H01L 21/823814 |

(Continued)

FOREIGN PATENT DOCUMENTS

WO  PCT/US2018/064411    4/2019
WO  PCT/US2018/064411    6/2020

OTHER PUBLICATIONS

Naito et al., "World's first monolithic 3D-FPGA with TFT SRAM over 90nm 9 layer Cu CMOS", IEEE, 2010 Symposium on VLSI Technology Digest of Technical Papers, Jun. 15-17, 2010, Honolulu, HI, USA, pp. 219-220.

*Primary Examiner* — Charles D Garber
*Assistant Examiner* — S M Sohel Imtiaz
(74) *Attorney, Agent, or Firm* — Wells St. John P.S.

(57) ABSTRACT

Some embodiments include an assembly having a CMOS tier. The CMOS tier includes a PMOS deck and an NMOS deck, with the decks being vertically offset relative to one another. The PMOS deck has p-channel transistors which are substantially identical to one another, and the NMOS deck has n-channel transistors which are substantially identical to one another. An insulative region is between the PMOS deck and the NMOS deck. The CMOS tier has one or more circuit components which include one or more of the n-channel transistors coupled with one or more of the p-channel transistors through one or more conductive interconnects extending through the insulative region. Some embodiments include methods of forming assemblies to comprise one or more CMOS tiers.

38 Claims, 34 Drawing Sheets

(51) Int. Cl.
| | |
|---|---|
| *H01L 21/8238* | (2006.01) |
| *H01L 21/84* | (2006.01) |
| *H01L 27/12* | (2006.01) |
| *H01L 23/528* | (2006.01) |
| *H01L 27/092* | (2006.01) |
| *H01L 27/115* | (2017.01) |
| *H01L 23/522* | (2006.01) |
| *H01L 27/06* | (2006.01) |
| *H01L 29/786* | (2006.01) |
| *H01L 29/78* | (2006.01) |

(52) U.S. Cl.
CPC ............ *H01L 21/84* (2013.01); *H01L 23/528* (2013.01); *H01L 23/5226* (2013.01); *H01L 27/0688* (2013.01); *H01L 27/092* (2013.01); *H01L 27/115* (2013.01); *H01L 27/1207* (2013.01); *H01L 29/7827* (2013.01); *H01L 29/78642* (2013.01)

(58) Field of Classification Search
CPC ........... H01L 21/823871; H01L 23/528; H01L 27/092; H01L 27/115; H01L 23/5226; H01L 29/78642; H01L 29/7827
See application file for complete search history.

(56) References Cited

U.S. PATENT DOCUMENTS

| | | | |
|---|---|---|---|
| 9,997,413 | B1 | 6/2018 | Leobandung |
| 10,043,797 | B2 | 8/2018 | Jun |
| 10,297,290 | B1 | 5/2019 | Beigel et al. |
| 10,340,267 | B1 | 7/2019 | Sills et al. |
| 2004/0018671 | A1* | 1/2004 | Noble .................... H01L 21/84 438/151 |
| 2008/0048237 | A1 | 2/2008 | Iwata |
| 2011/0260259 | A1* | 10/2011 | Masuoka .............. H01L 27/092 257/369 |
| 2013/0235642 | A1* | 9/2013 | Heineck ................. G11C 5/063 365/72 |
| 2013/0308363 | A1* | 11/2013 | Scheuerlein ......... G11C 13/003 365/63 |
| 2015/0311142 | A1* | 10/2015 | Sekar .............. H01L 21/823475 257/499 |
| 2016/0204251 | A1* | 7/2016 | Masuoka ........ H01L 21/823842 257/329 |
| 2016/0211259 | A1* | 7/2016 | Guo ................ H01L 21/823885 |
| 2017/0025412 | A1* | 1/2017 | Jun ................... H01L 29/66666 |
| 2017/0294377 | A1* | 10/2017 | Dunga ................ H01L 23/5226 |
| 2018/0114726 | A1 | 4/2018 | Odnoblyudov |
| 2018/0277442 | A1* | 9/2018 | Leobandung ....... H01L 27/0688 |
| 2019/0181054 | A1* | 6/2019 | Hook .................. H01L 23/5383 |
| 2019/0206861 | A1 | 7/2019 | Beige et al. |

* cited by examiner

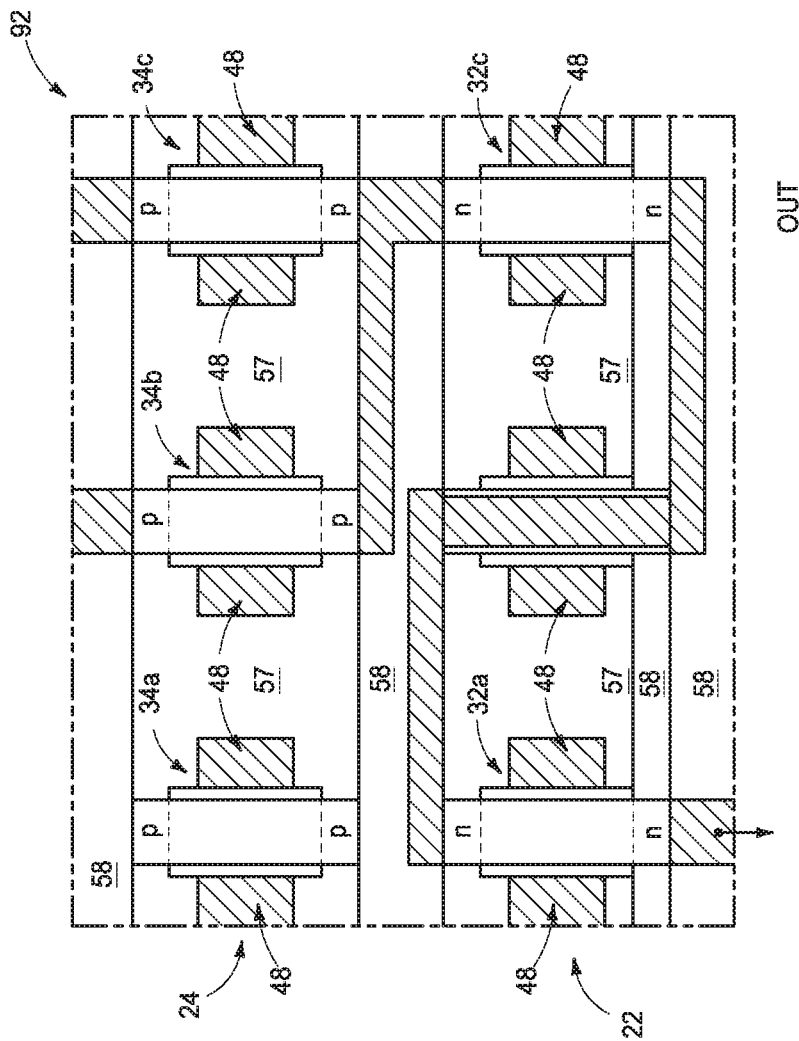
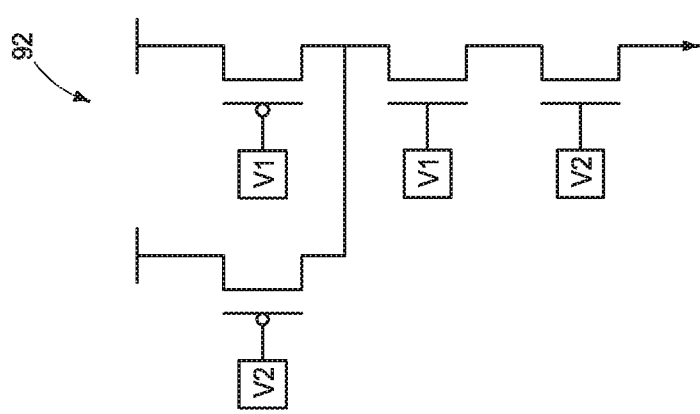
FIG. 11

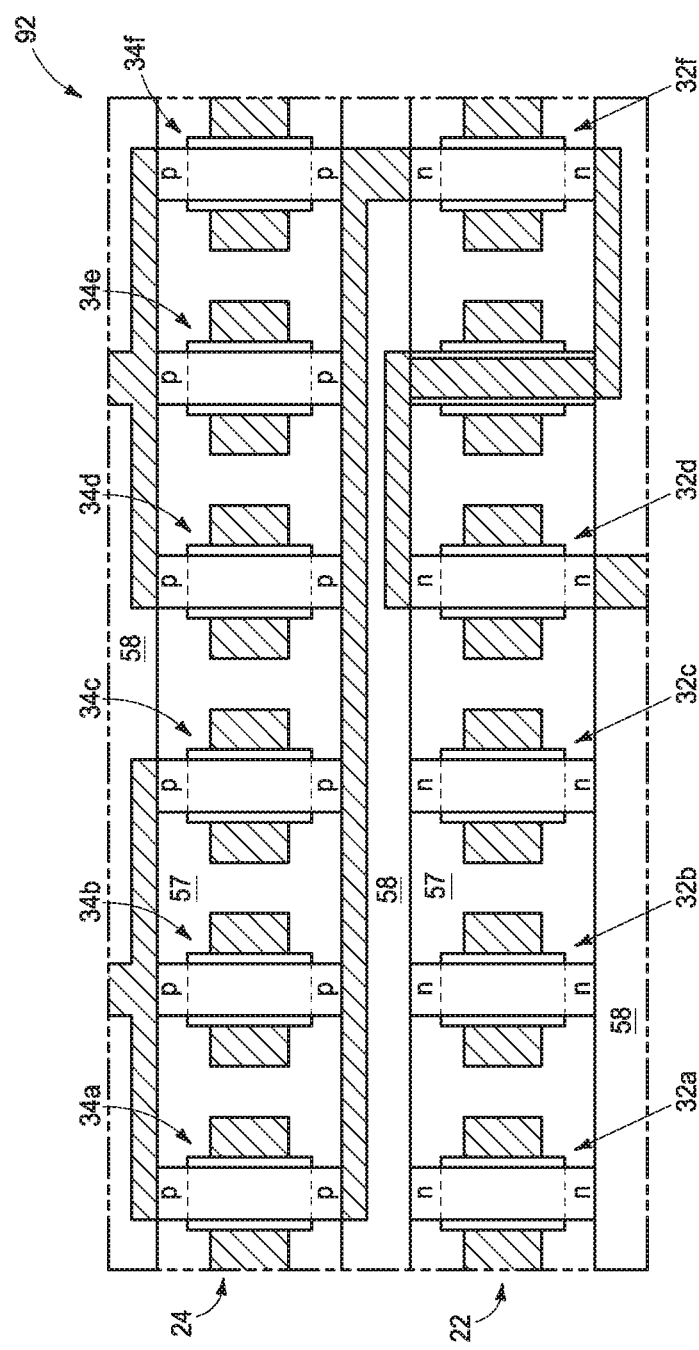
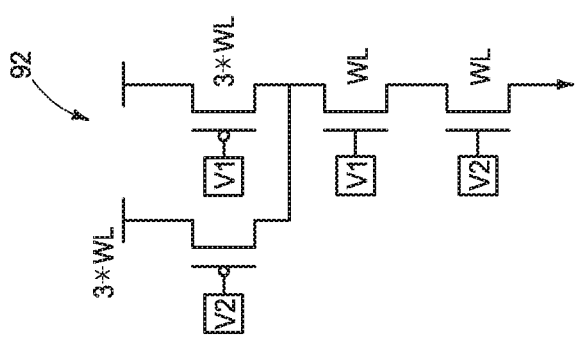
FIG. 12

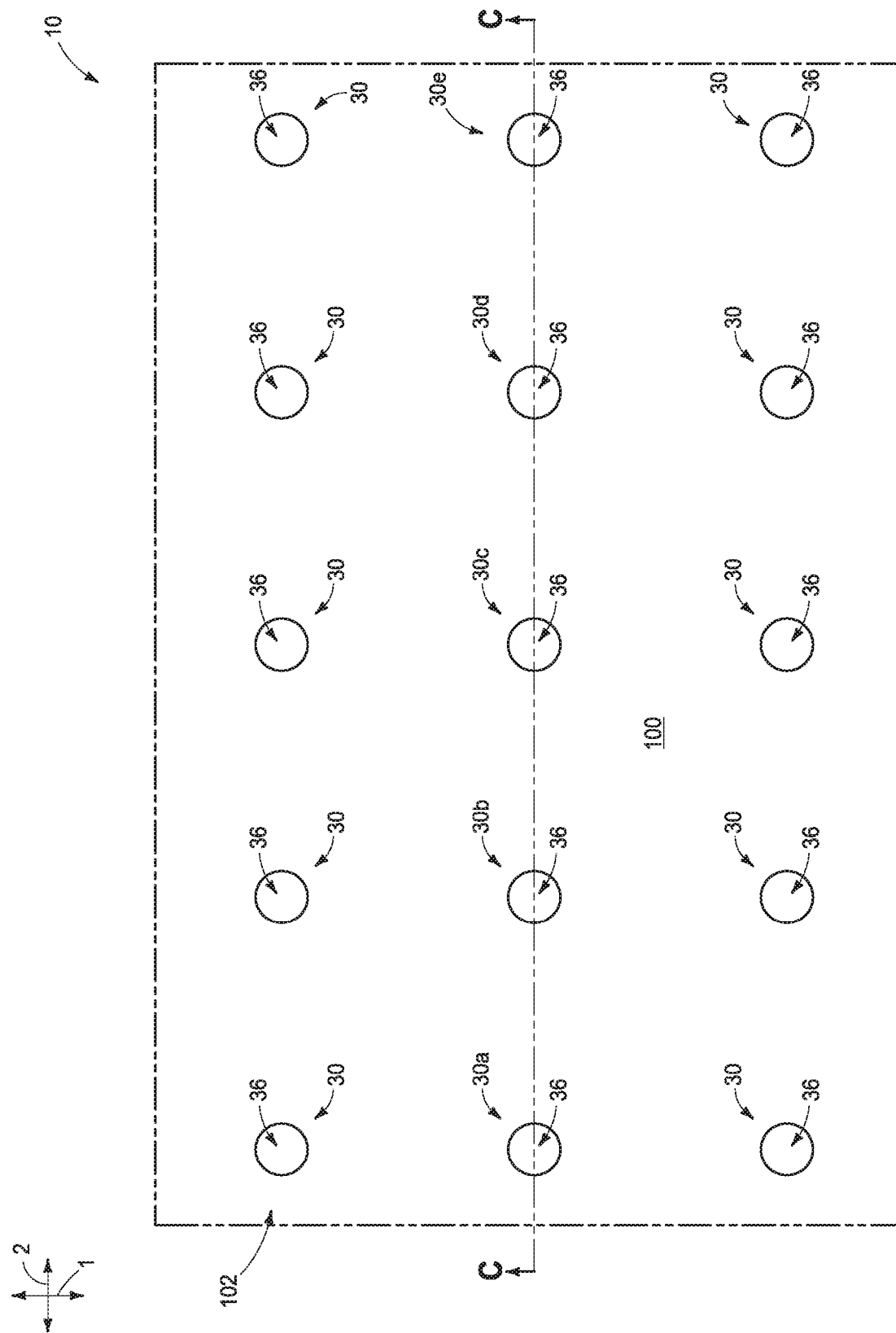

ASSEMBLIES CONTAINING PMOS DECKS VERTICALLY-INTEGRATED WITH NMOS DECKS, AND METHODS OF FORMING INTEGRATED ASSEMBLIES

RELATED PATENT DATA

This patent resulted from a divisional of U.S. patent application Ser. No. 15/857,974, which was filed Dec. 29, 2017, and which is hereby incorporated herein by reference.

TECHNICAL FIELD

Assemblies containing PMOS decks vertically-integrated with NMOS decks, and methods of forming integrated assemblies.

BACKGROUND

Integrated circuitry frequently utilizes CMOS (complementary metal-oxide-semiconductor) for providing operational control relative to other components. For instance, CMOS may be provided adjacent a memory array and utilized for controlling read/write operations associated with the memory array.

CMOS comprises PMOS (p-type metal oxide semiconductor) transistors and NMOS (n-type metal oxide semiconductor) transistors.

A continuing goal of integrated circuit design is to increase the level of integration, and a related goal is to reduce the size of integrated circuit components. In some applications, an integrated device tier (for instance, a memory array) may be provided over CMOS, and electrically coupled with the CMOS. Substantial efforts are made to improve the integration density of the integrated device tier, resulting in substantial reduction in the size of individual components associated with the integrated device tier; and possibly also resulting in a substantial reduction in the overall footprint of the integrated device tier. However, the overall footprint of the integrated device tier and associated CMOS may not be appreciably reduced by increasing the level of integration within the integrated device tier alone. Instead, it would be desirable to also increase the level of integration within the CMOS.

In many applications, fabrication of CMOS utilizes high-temperature processing which would problematically affect an integrated device tier associated with the CMOS. Accordingly, the CMOS is formed before the integrated device tier. Such fabrication sequence limits options available as to the overall placement of the CMOS. It would be desirable to develop new methods for CMOS fabrication which alleviate the requirement for fabricating the CMOS prior to fabricating associated integrated device tiers.

BRIEF DESCRIPTION OF THE DRAWINGS

FIG. 11 is a diagrammatic cross-sectional side view of a region of an example CMOS tier (right side), and a circuit diagram (left side) illustrating the arrangement of the components within the illustrated region of the CMOS tier.

FIG. 12 is a diagrammatic cross-sectional side view of a region of an example CMOS tier (right side), and a circuit diagram (left side) illustrating the arrangement of the components within the illustrated region of the CMOS tier.

FIGS. 13A-21A are views along the lines A-A of FIGS. 13-24; and FIGS. 13-24 are views along the lines C-C of FIGS. 13A-21A.

FIGS. 13B-1 and 13B-2 are views along the line B-B of FIG. 13; and FIG. 13 is a view along the lines C-C of FIGS. 13B-1 and 13B-2.

DETAILED DESCRIPTION OF THE ILLUSTRATED EMBODIMENTS

Some embodiments include assemblies having a CMOS tier adjacent an integrated device tier (e.g., a memory array tier, a sensor tier, etc.); with the CMOS tier having a PMOS deck vertically offset from an NMOS deck. Vertical stacking of the PMOS and NMOS decks of the CMOS tier may enable the CMOS tier to be highly integrated. In some embodiments, the PMOS and NMOS decks may comprise thin-film transistors more suitable for lower temperature processing than the transistors of conventional CMOS; which may enable the CMOS tier to be fabricated after the integrated device tier. In some embodiments, the CMOS tier may be vertically stacked relative to the integrated device tier. In some embodiments, a vertical stack may comprise a pair of integrated device tiers, and a CMOS tier between the integrated device tiers. Example embodiments are described with reference to FIGS. 1-24.

Figure 1:
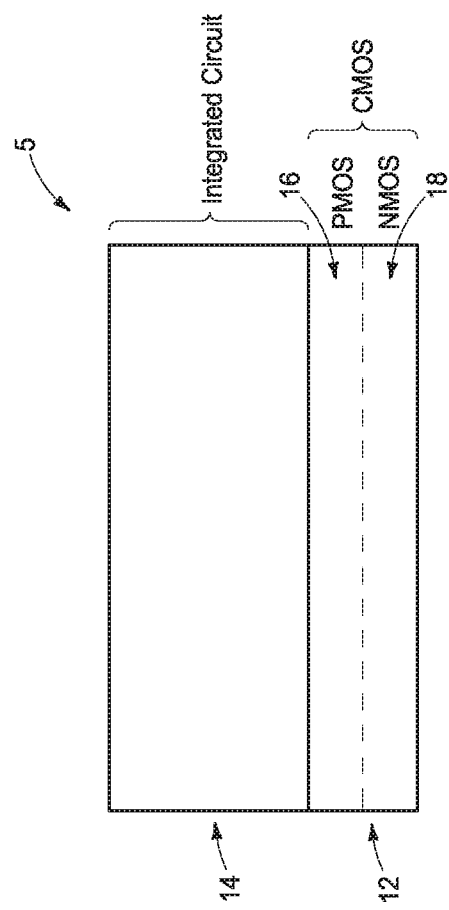
FIGS. 1-3 are diagrammatic cross-sectional side views of example assemblies comprising a CMOS tier vertically offset from at least one integrated device tier.
Figure 2:
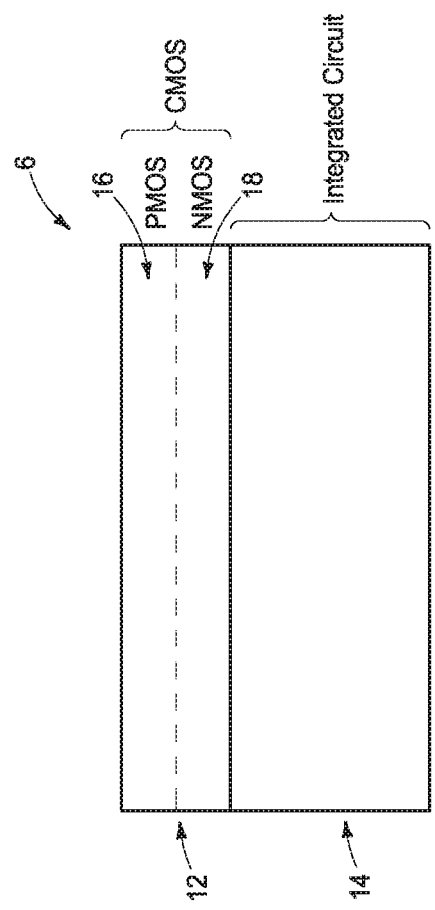
Figure 3:
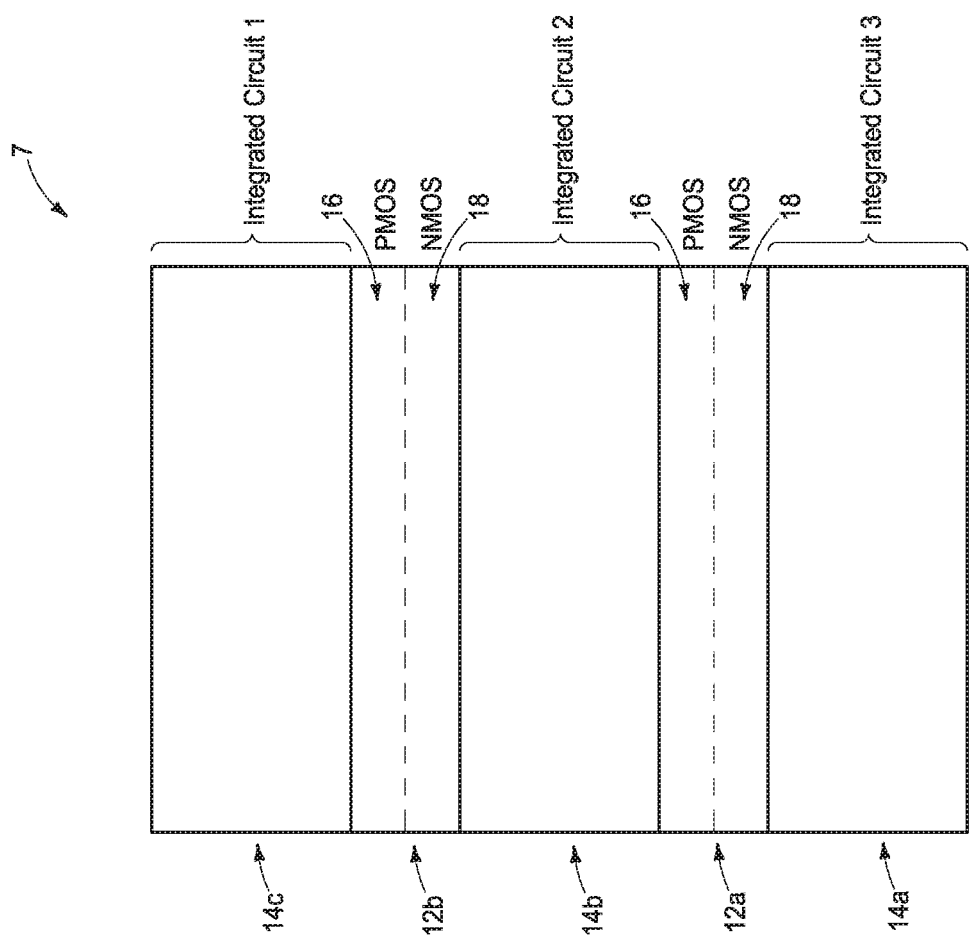

Some embodiments include assemblies in which a CMOS tier is vertically offset relative to an integrated device tier, and in which one or more structures from the integrated device tier are coupled with one or more circuit components of the CMOS tier. FIGS. 1-3 show example assemblies 5-7 in which CMOS tiers are vertically offset relative to integrated circuit tiers. The integrated circuit tiers may include any suitable integrated circuitry; such as, for example, memory/storage, sensors, etc.

FIG. 1 shows a configuration in which a CMOS tier 12 is under an integrated circuit tier 14, and FIG. 2 shows a configuration in which the CMOS tier 12 is over the integrated circuit tier 14. In each case the CMOS tier comprises a first deck 16 vertically stacked over a second deck 18, with one of the decks being a PMOS deck and the other being an NMOS deck. In the illustrated embodiments, the PMOS deck is over the NMOS deck. In other embodiments, the NMOS deck may be over the PMOS deck.

The embodiments of FIGS. 1 and 2 have a single CMOS tier associated with a single integrated circuit tier. In other embodiments, there may be two or more CMOS tiers and/or two or more integrated circuit tiers. For instance, FIG. 3 shows a configuration in which there are three integrated circuit tiers 14a-c, and two CMOS tiers 12a and 12b. The CMOS tier 12a may comprise components coupled with structures from either or both of the integrated circuit tiers 14a and 14b; and similarly, the CMOS tier 12b may comprise components coupled with structures from either or both of the integrated circuit tiers 14b and 14c. In some embodiments, the integrated circuit tiers 14a-c of FIG. 3 may all comprise the same type of circuitry as one another (for instance, may all comprise memory/storage); and in other embodiments at least one of the integrated circuit tiers may comprise a different type of circuitry relative to at least one other of the integrated circuit tiers (for instance, one of the integrated circuit tiers may primarily comprise sensors while another primarily comprises memory).

The integrated circuit tiers of FIG. 3 are labeled 14a-c so that the illustrated three integrated circuit tiers may be distinguished from one another, and the CMOS tiers of FIG. 3 are labeled 12a, 12b so that the illustrated two CMOS tiers may be distinguished from one another. However, in some embodiments it is useful to simply generically refer to all of the integrated circuit tiers of FIG. 3 as tiers 14; and to generically refer to all of the CMOS tiers of FIG. 3 as tiers 12.

The CMOS tiers 12 of FIGS. 1-3 are shown to comprise two decks, with one of the deck being a PMOS deck and the other being an NMOS deck. In other embodiments, CMOS tiers may comprise more than two decks; with at least one of the decks being a PMOS deck and at least one other of the decks being an NMOS deck. For instance, example CMOS tiers may comprise a PMOS deck between two NMOS decks; an NMOS deck between two PMOS decks; two or more total decks which alternate between PMOS decks and NMOS decks, etc.

Figure 4:
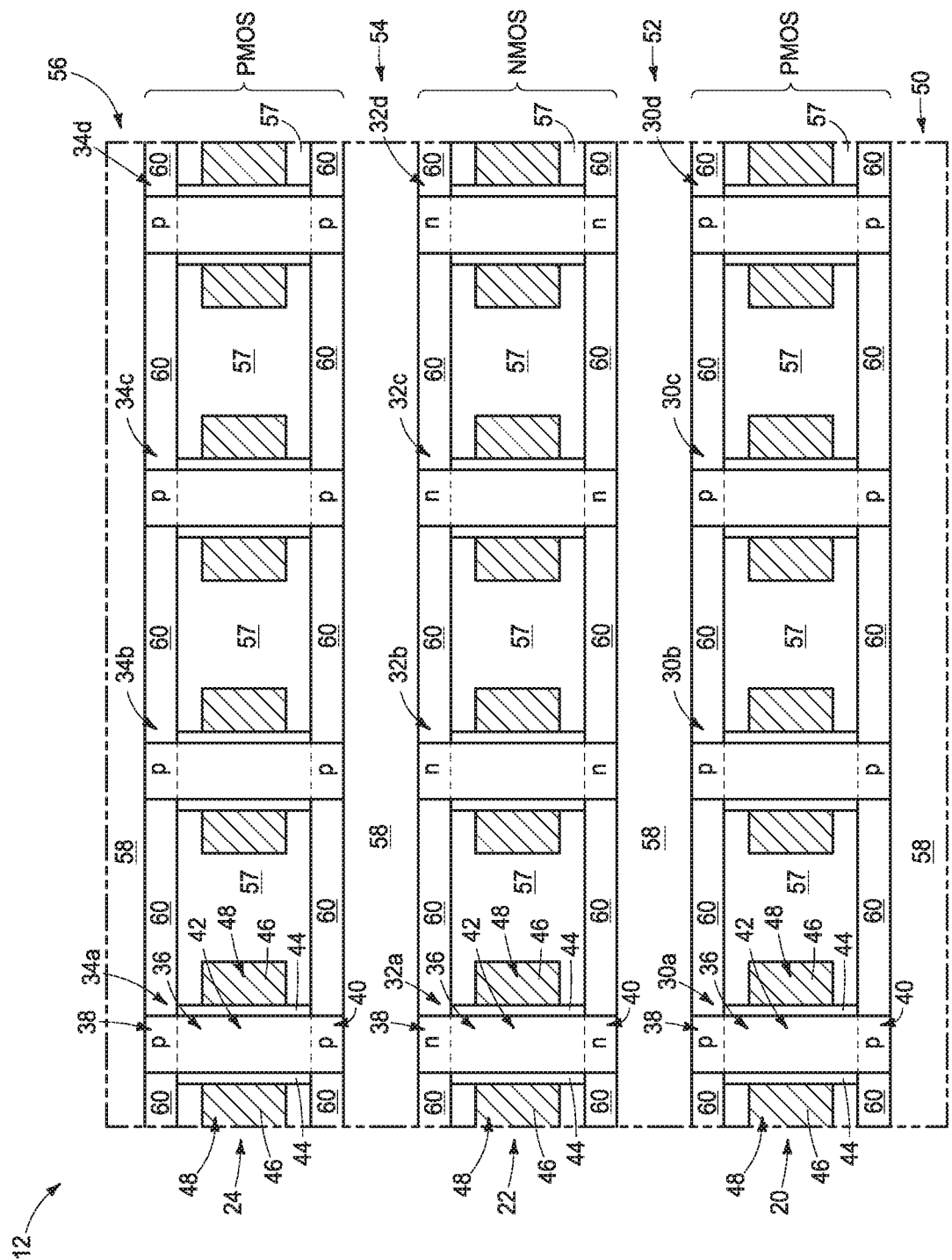
FIGS. 4 and 5 are diagrammatic cross-sectional views of example CMOS tiers comprising one or more PMOS decks vertically offset from one or more NMOS decks.
Figure 5:
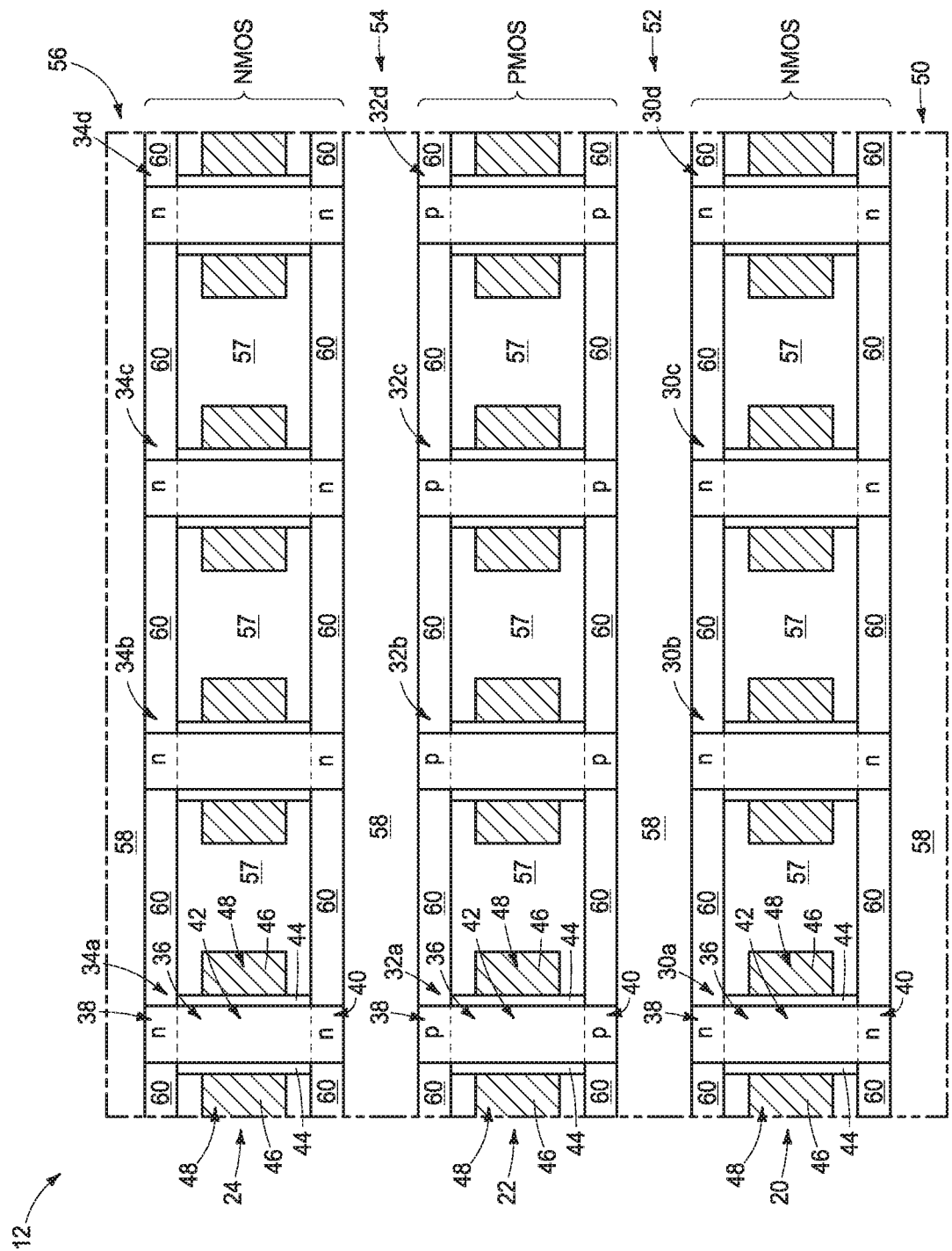

The CMOS tiers of FIGS. 1-3 may comprise any suitable configuration. In some embodiments, the CMOS tiers may comprise thin-film transistors (TFTs) suitable for fabrication under relatively low-temperature conditions such that the CMOS tiers may be fabricated after formation of one or more integrated circuit tiers. FIGS. 4 and 5 illustrate example configurations for CMOS tiers 12, with each of the configurations showing a central deck 22 vertically sandwiched between a lower deck 20 and an upper deck 24. The illustrated configuration of FIG. 4 has an NMOS deck vertically sandwiched between a pair of PMOS decks, and the illustrated configuration of FIG. 5 has a PMOS deck vertically sandwiched between a pair of NMOS decks.

The lower decks 20 of FIGS. 4 and 5 have a plurality of transistors 30a-d, the central decks 22 have a plurality of transistors 32a-d, and the upper decks 24 have a plurality of transistors 34a-d. Each of the transistors has a vertically-extending semiconductor pillar 36 (only some which are labeled); with each pillar comprising an upper source/drain region 38, a lower source/drain region 40, and a channel region 42 between the upper and lower source/drain regions (only a few of the source/drain regions 38, source/drain regions 40 and channel regions 42 are labeled). Each transistor (30a-d, 32a-d and 34a-d) comprises gate dielectric material 44 along the channel region 42, and conductive gate material 46 along the gated dielectric material 44 (only some of the gate dielectric material 44 and conductive gate material 46 is labeled). The gate material 46 is configured as transistor gates 48 which gatedly couple the upper and lower source/drain regions 38 and 40 to one another through the channel region 42 (only some of the transistor gates 48 are labeled).

The semiconductor pillars 36 may comprise any suitable semiconductor material; including, for example, one or more of silicon, germanium, III/V devices (e.g. gallium phosphide), semiconductor oxides, etc.

The gate dielectric material 44 may comprise any suitable composition or combination of compositions; including, for example, one or more of silicon dioxide, silicon nitride, high-k dielectrics, etc.

The gate material 46 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The source/drain regions 38 and 40 of the PMOS devices are p-type doped, and the source/drain regions 38 and 40 of the NMOS devices are n-type doped. In some embodiments, the PMOS devices (e.g., the PMOS transistors 30a-d and 34a-d of FIG. 4) may be referred to as p-channel transistors, and the NMOS devices (e.g., the NMOS transistors 32a-d of FIG. 4) may be referred to as n-channel transistors. The PMOS transistors may have n-type doped channel (i.e., body) regions, but, in accordance with generally-accepted parlance, are referred to as p-channel devices due to the channels being operated to conduct holes between p-type source/drain regions. Similarly, the NMOS transistors may have p-type doped channel (i.e., body) regions, but, in accordance with generally-accepted parlance, are referred to as n-channel devices due to the channels being operated to conduct electrons between n-type source/drain regions.

The transistors within each of the individual decks 20, 22 and 24 of FIGS. 4 and 5 may be substantially identical to one another (with the term "substantially identical" meaning identical to within reasonable tolerances of fabrication and measurement). For instance, all of the p-channel transistors 34a-d within the upper deck 24 of FIG. 4 may be substantially identical to one another. Further, the transistors within the upper deck 24 may be substantially identical to the transistors within the lower deck 20 in some embodiments. In other embodiments, the transistors within the upper deck 24 may differ from the transistors within the lower deck 20 in one or more characteristics, such as, for example, in one or more of effective gate width, effective gate length, threshold voltage, on-current, off-current, etc. In some embodiments, the lower deck 20 of FIG. 4 may be referred to as a first PMOS deck, and the transistors 30a-d may be referred to as first p-channel transistors; the upper deck 24 of FIG. 4 may be referred to as a second PMOS deck, and the transistors 34a-d may be referred to as second p-channel transistors; and the NMOS deck 22 of FIG. 4 may be considered to be between the first and second PMOS decks. In some embodiments, the lower deck 20 of FIG. 5 may be referred to as a first NMOS deck, and the transistors 30a-d may be referred to as first n-channel transistors; the upper deck 24 of FIG. 5 may be referred to as a second NMOS deck, and the transistors 34a-d may be referred to as second n-channel transistors; and the PMOS deck 22 of FIG. 5 may be considered to be between the first and second NMOS decks.

The transistors within each of the decks 20, 22 and 24 of FIGS. 4 and 5 are laterally spaced from one another by insulative material 57. Such insulative material may comprise any suitable composition or combination of compositions; and in some embodiments may comprise one or more of silicon nitride, silicon dioxide, aluminum oxide, etc. In some example embodiments, the insulative material 57 may comprise, consist essentially of, or consist of silicon dioxide. In some example embodiments, the insulative material 57 may comprise two or more discrete compositions; such as, for example, a stack of insulative materials. In some example embodiments, the insulative material 57 may consist partly, or substantially entirely of, air-gaps or voids.

The decks 20, 22 and 24 alternate with insulative regions 50, 52, 54 and 56 in the embodiments of FIGS. 4 and 5. Such insulative regions comprise insulative material 58. The insulative material 58 may comprise any suitable composition or combination of compositions; and in some embodiments may comprise, consist essentially of, or consist of silicon dioxide. Although the insulative material 58 is shown to be a single homogeneous composition, in other embodiments the material 58 may comprise multiple discrete compositions; such as a vertical stack of different compositions. Also, although all of the insulative regions 50, 52, 54 and 56 are shown comprising the same insulative material 58, in other embodiments one or more of the insulative regions 50, 52, 54 and 56 may comprise a different insulative material than one or more of the other insulative regions.

In the illustrated embodiments of FIGS. 4 and 5, an insulative material 60 extends laterally between adjacent source/regions 38 and 40 within the NMOS/PMOS decks 20, 22 and 24. In some embodiments, such insulative material 60 may be different from the materials 57 and 58, and in other embodiments the insulative material 60 may be the same as one or both of the insulative materials 57 and 58. If any of the insulative materials 57, 58 and 60 are the same composition as one another, such may merge into a single insulative composition rather than being the illustrated separate compositions. In the embodiments described below, various of the insulative materials 57, 58 and 60 are replaced by a single insulative material (e.g., materials 57 and 58 may be replaced by a single material 57, materials 58 and 60 may be replaced by a single material 58, etc.) in order to simplify the drawings. It is to be understood, however, that such embodiments could alternatively comprise any or all of the different materials 57, 58 and 60, and/or could comprise additional insulative materials besides the materials 57, 58 and 60.

Some embodiments include circuit components within the CMOS tier, with such circuit components including n-channel transistors from one deck of the CMOS tier coupled with p-channel transistors of another deck of the CMOS tier. Example components are described with reference to FIGS. 6-12.

Figure 6:
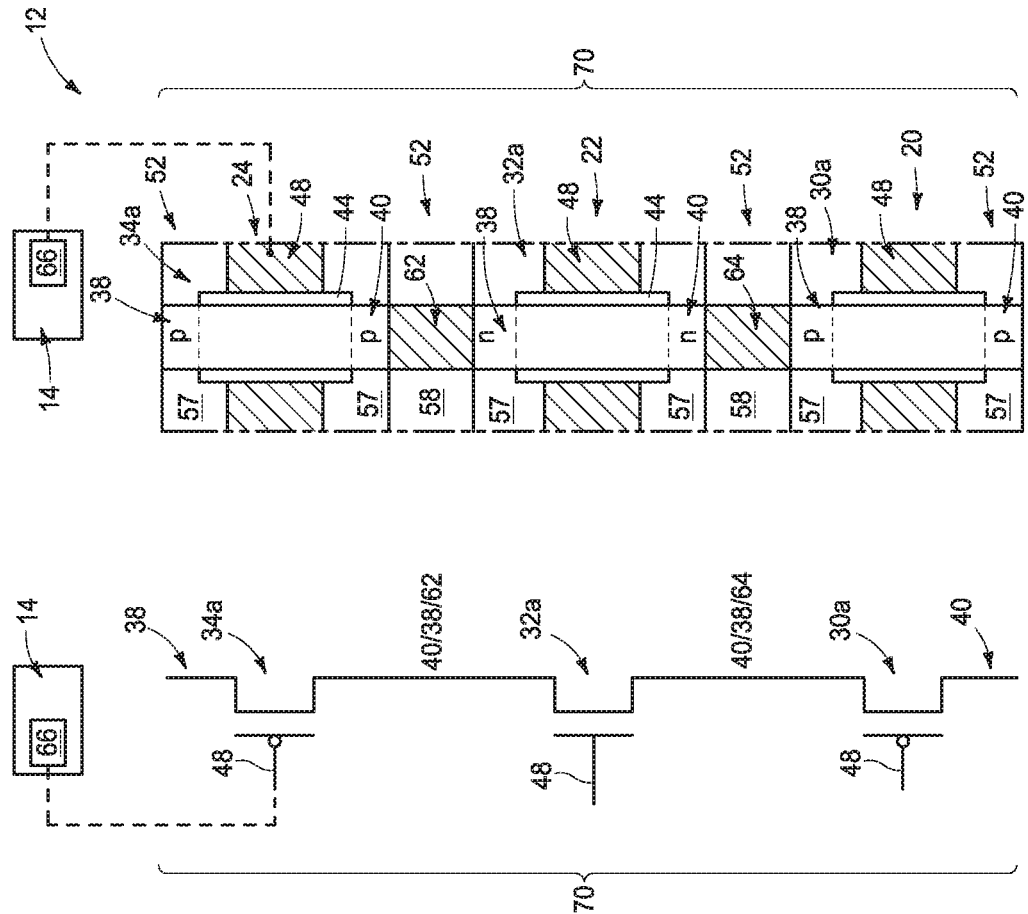
FIG. 6 is a diagrammatic cross-sectional side view of a region of an example CMOS tier (right side), and a circuit diagram (left side) illustrating the arrangement of the components within the illustrated region of the CMOS tier.

Referring to FIG. 6, a region of a CMOS tier 12 is illustrated on the right side of the figure. Such region includes the decks 20, 22 and 24; and the insulative regions 52 alternating with the decks. The lower deck 20 and upper deck 24 are PMOS decks, and comprise p-channel transistors 30a and 34a, respectively. The middle deck 22 is an NMOS deck, and comprises an n-channel transistor 32a. A first conductive interconnect 62 electrically couples the lower source/drain region 40 of the p-channel transistor 34a with the upper source/drain region 38 of the n-channel transistor 32a, and a second conductive interconnect 64 electrically couples the lower region 40 of the n-channel transistor 32a with the upper source/drain region 38 of the p-channel transistor 30a.

The first and second interconnects 62 and 64 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The first and second interconnects 62 and 64 may comprise a same composition as one another, or may comprise different compositions relative to one another.

A CMOS circuit component 70 is formed by coupling the transistors 30a, 32a and 34a to one another. A schematic diagram on the left side of FIG. 6 illustrates the circuit component 70. Such circuit component 70 may be electrically coupled to integrated circuitry 14 (FIGS. 1-3) formed above and/or below the CMOS tier 12 by coupling one or more of the transistor gates 48 with one or more structures within the integrated circuitry, and/or by coupling the source/drain 38 of the upper transistor 34a with one or more structures within the integrated circuitry, and/or by coupling the source/drain region 40 of the lower transistor 30a with one or more structures within the integrated circuitry. FIG. 6 diagrammatically illustrates the upper transistor gate 48 associated with transistor 34a being coupled with a structure 66 within integrated circuitry 14 adjacent the CMOS tier 12. The structure 66 may be, for example, a memory/storage cell, a sensor, etc. In some embodiments, the gate 48 may extend to a wordline which is coupled with wordlines extending across a memory array within the integrated circuitry 14.

The embodiment of FIG. 6 diagrammatically illustrates the integrated circuitry 14 as being vertically above the CMOS tier 12. In other embodiments, the integrated circuitry 14 may be laterally adjacent the CMOS tier 12, beneath the CMOS tier 12, or in any other suitable location relative to the CMOS tier 12.

The CMOS circuit component 70 of FIG. 6 comprises the first and second p-channel transistors 30a and 34a, and the n-channel transistor 32a. Such CMOS component 70 may be considered to be representative of a class of components comprising, at least one first p-channel transistor (i.e., at least one of the transistors 30a-d of FIG. 4), at least one second p-channel transistor (i.e., at least one of the transistors 34a-d of FIG. 4) and at least one n-channel transistor (i.e., at least one of the transistors 32a-d of FIG. 4). Analogous CMOS circuit components may comprise at least one first n-channel transistor (i.e., at least one of the transistors 30a-d of FIG. 5), at least one second n-channel transistor (i.e., at least one of the transistors 34a-d of FIG. 5) and at least one p-channel transistor (i.e., at least one of the transistors 32a-d of FIG. 5).

Figure 7:
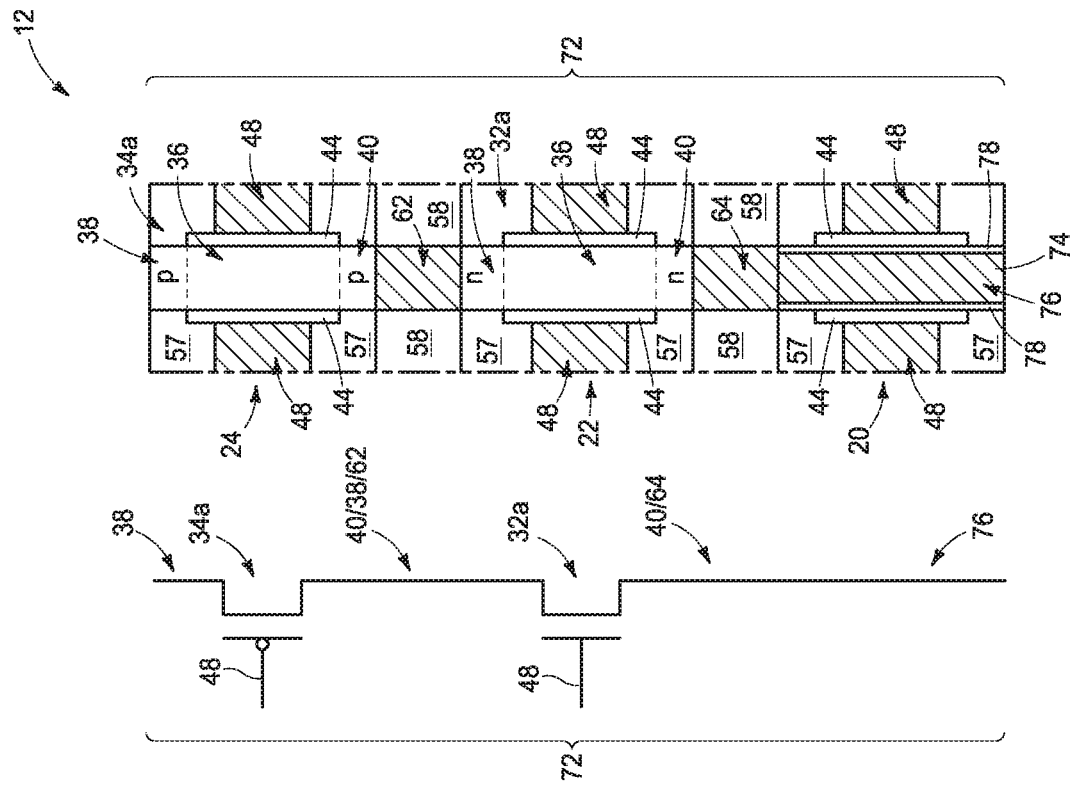
FIG. 7 is a diagrammatic cross-sectional side view of a region of an example CMOS tier (right side), and a circuit diagram (left side) illustrating the arrangement of the components within the illustrated region of the CMOS tier.

Referring to FIG. 7, another CMOS circuit component 72 is illustrated. The CMOS tier 12 of FIG. 7 comprises the upper p-channel transistor 34a coupled to the n-channel transistor 32a through the interconnect 62. However, the lower p-channel transistor (shown in FIG. 4 as a transistor 30a) is modified to become a conductive interconnect. Specifically, the semiconductor material pillar 36 (shown in FIG. 4 relative to the transistor 30a) is replaced with conductive material 74. The conductive material 74 is configured as a conductive interconnect 76 extending through the lower deck 20 of the CMOS tier 12. The lower source/ drain region 40 of the n-channel transistor 32a is coupled with the conductive interconnect 76 through the interconnect 64. The conductive interconnect 76 may extend to circuitry outside of the CMOS tier 12, and in some embodiments may extend to circuitry associated with an integrated circuit tier (such as, for example, one of the tiers 14 of FIGS. 2 and 3). Alternatively, or additionally, the component 72 of FIG. 7 may be coupled with integrated circuitry of an integrated circuit tier through either or both of the gates 48 of transistor 32a and 34a, and/or through the upper source/drain region 38 of the upper transistor 34a.

The conductive material 74 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The embodiment of FIG. 7 shows an optional insulative material 78 formed between the gate dielectric 44 and the interconnect 76. The insulative material 78 may comprise any suitable composition; and in some embodiments may comprise, consist essentially of, or consist of silicon dioxide and/or other suitable low-k material to reduce capacitive coupling between the gate 48 of the bottom tier 20 and the interconnect 76 (with "low-k" meaning a dielectric constant less than or equal to that of silicon dioxide). If capacitive coupling is found to be within acceptable tolerances in the absence of the material 78, such material may be omitted.

The component 72 of FIG. 7 is an example of a semiconductor component having a conductive interconnect (e.g., interconnect 76) extending through one of the CMOS decks (e.g., the decks 20, 22 and 24). An analogous component may be formed utilizing the configuration of FIG. 5 instead of that of FIG. 4; and such component would comprise an upper NMOS transistor within deck 24, coupled to a PMOS transistor within deck 22, which in turn is coupled with the conductive interconnect within deck 20.

Figure 8:
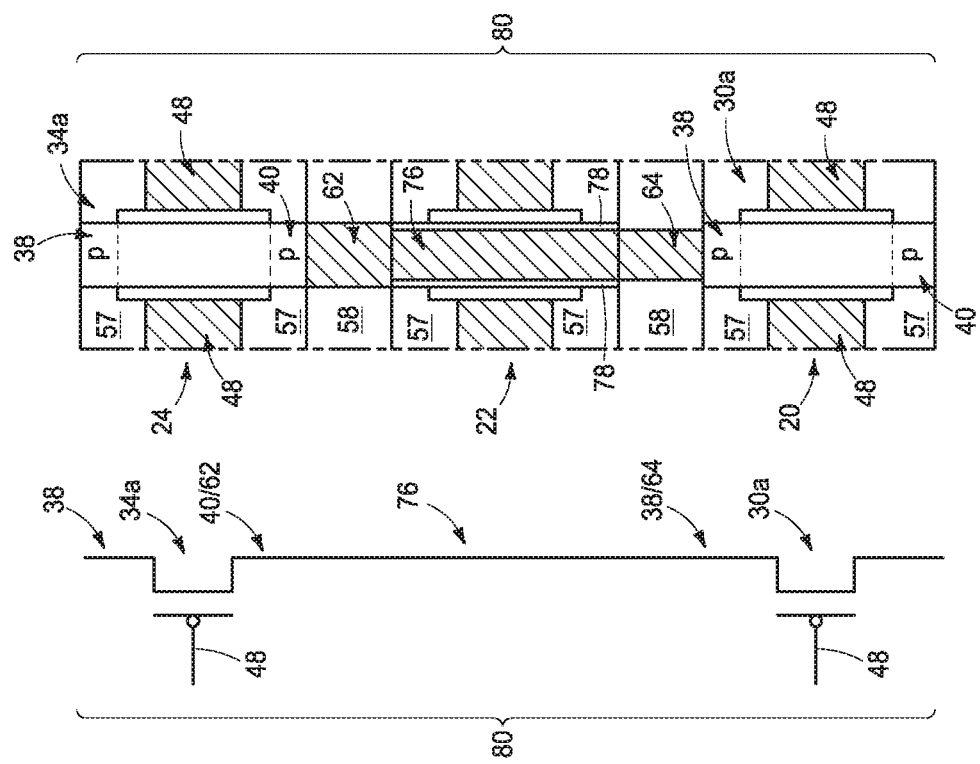
FIG. 8 is a diagrammatic cross-sectional side view of a region of an example CMOS tier (right side), and a circuit diagram (left side) illustrating the arrangement of the components within the illustrated region of the CMOS tier.

FIG. 8 shows a CMOS circuit component 80 illustrating another embodiment in which a vertical interconnect 76 extends through one of the decks of a CMOS tier (e.g., the decks 20, 22 and 24). The embodiment of FIG. 8 has the interconnect 76 extending through the middle tier 22, and coupling the upper PMOS transistor 34a with the lower PMOS transistor 30a (in some embodiments, an interconnect extending through a middle deck of a CMOS tier may be utilized to shunt across such tier). The embodiment of FIG. 8 may be considered to have a region of the conductive interconnect 76 passing through the second deck 22. The region of the conductive interconnect 76 may be considered to be laterally surrounded by a first insulative material 78 which directly contacts the region of the conductive interconnect. The first insulative material 78 may be considered to be laterally surrounded by a second insulative material 44 (labeled in FIG. 7) which directly contacts the first insulative material. The first and second insulative materials may be different from one another The embodiment of FIG. 8 utilizes a CMOS tier of the type shown in FIG. 4. An analogous circuit component may be formed utilizing decks of the type shown in FIG. 5 instead of those of FIG. 4, and such would have an upper NMOS transistor 34a coupled with a lower NMOS transistor 30a.

Figure 9:
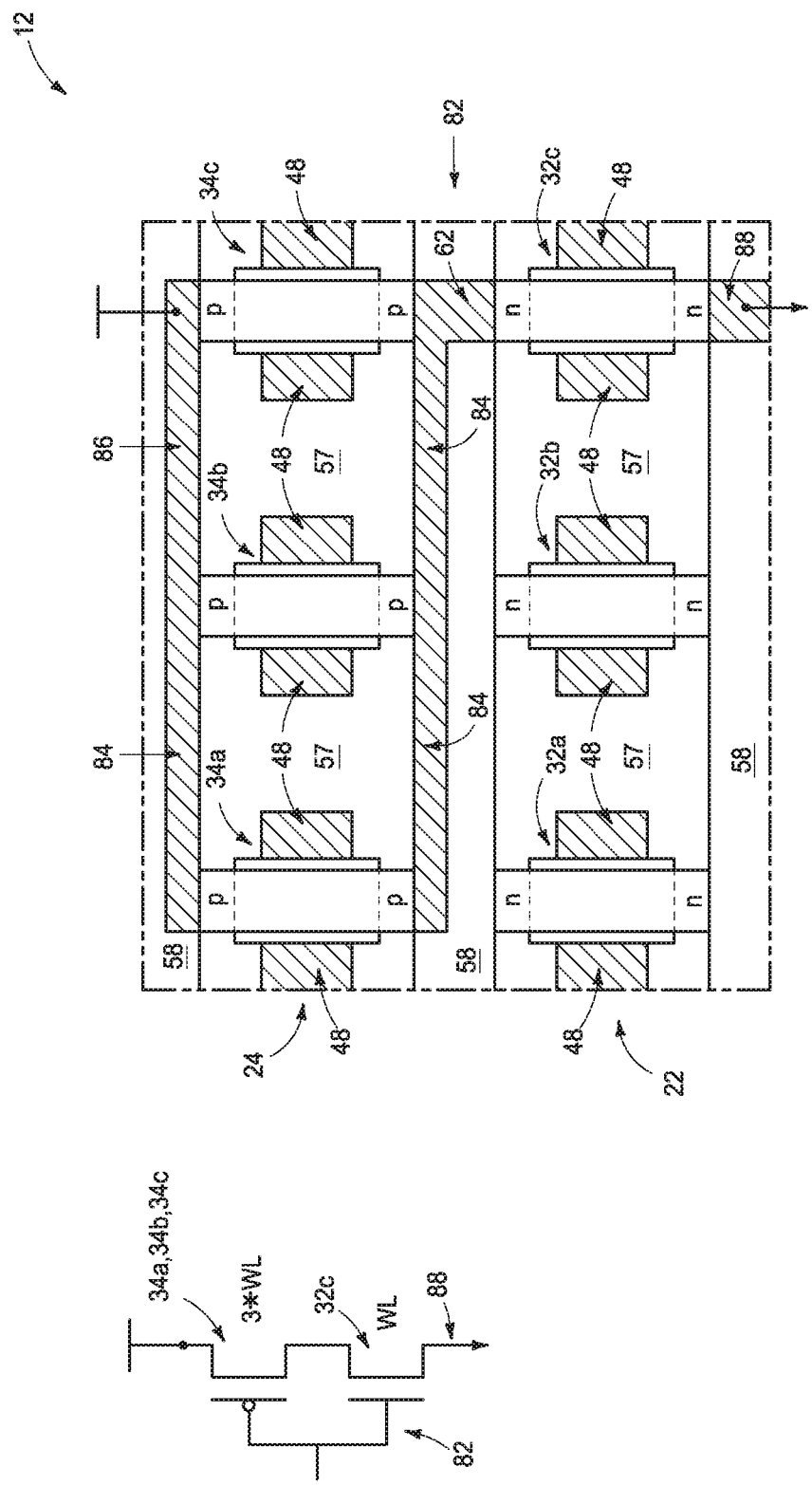
FIG. 9 is a diagrammatic cross-sectional side view of a region of an example CMOS tier (right side), and a circuit diagram (left side) illustrating the arrangement of the components within the illustrated region of the CMOS tier.

The components 70, 72 and 80 of FIGS. 6-8 illustrate vertical interconnection between decks of a CMOS tier (i.e., illustrate serial connection between vertically-offset transistors). In some embodiments, horizontal connections may be formed to couple transistors within a common CMOS deck in order to form parallel connections amongst such transistors. FIG. 9 illustrates an inverter 82 having parallel connections 84 and 86 between p-channel transistors 34a-c within an upper deck 24 of a CMOS tier, and having a vertical connection 62 between the transistor 34c of the upper deck and an n-channel transistor 32c of the lower deck. The circuit diagram to the left of FIG. 9 illustrates the transistors 34 and 32 as being along the wordlines (WL), with it being understood that the transistor gates 48 associated with each transistor may be along wordlines extending in and out of the page relative to FIG. 9 (with example wordlines within a CMOS deck being shown and described below with reference to FIGS. 13B-1 and 13B-2).

Although the CMOS tier 12 of FIG. 9 is shown to only comprise two decks (22 and 24), it is to be understood that additional decks (for instance, the deck 20 of FIG. 4) may be present within the CMOS tier in some embodiments.

The inverter 82 of FIG. 9 may be coupled with integrated circuitry (for instance, the integrated circuit tiers 14 described with reference to FIGS. 1-3) through an interconnect 88 diagrammatically illustrated in FIG. 9.

The embodiment of FIG. 9 is an inverter having more transistors of one type than transistors of another type (and specifically shows more PMOS transistors than NMOS transistors). It may be advantageous to utilize more PMOS transistors than NMOS transistors within the inverter in order to balance an electrical draw across the PMOS transistors relative to the draw across the NMOS transistors. However, in other embodiments, analogous inverters may comprise an equal number of PMOS transistors and NMOS transistors, or may comprise more NMOS transistors than PMOS transistors.

Figure 10:
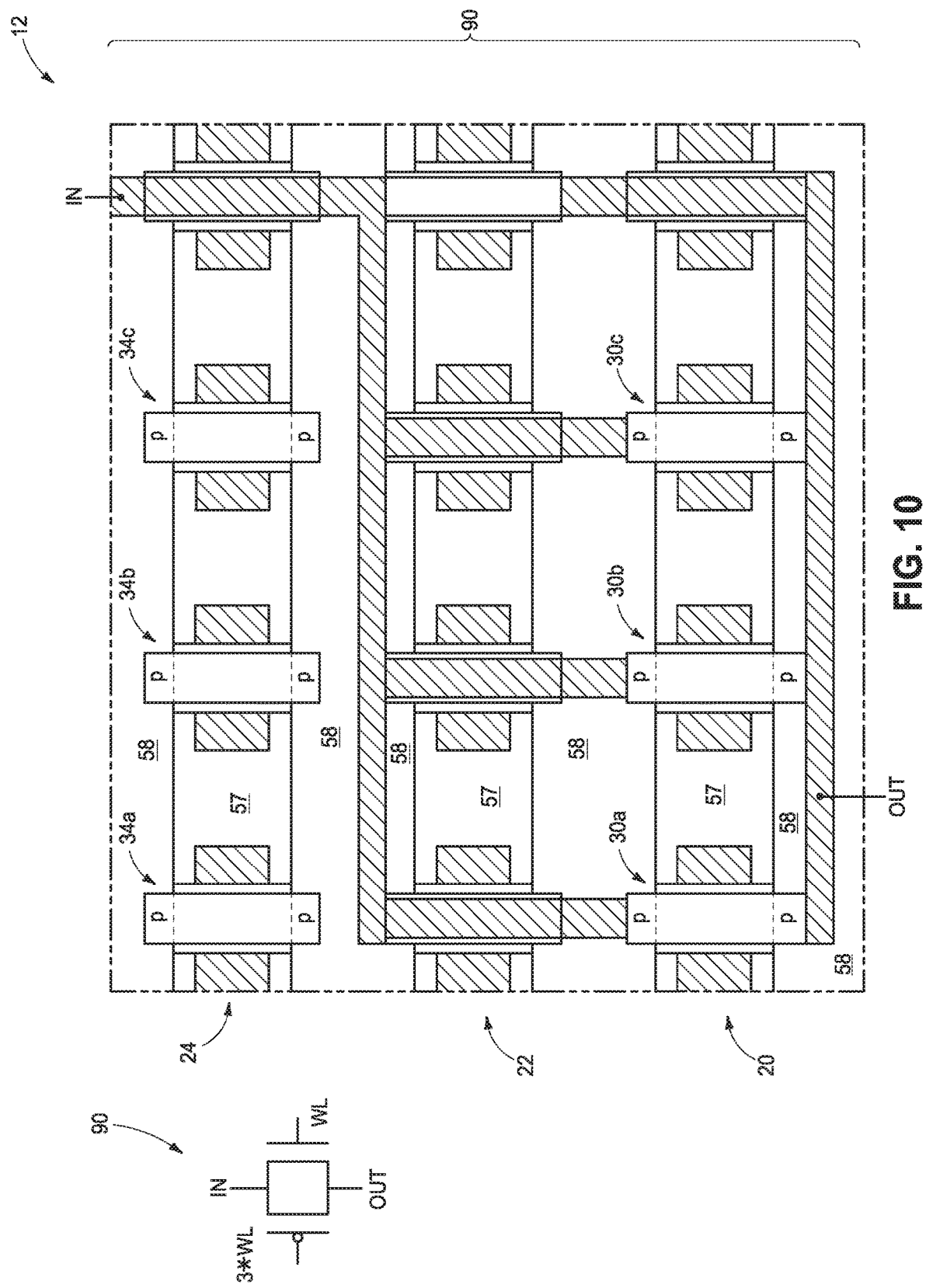
FIG. 10 is a diagrammatic cross-sectional side view of a region of an example CMOS tier (right side), and a circuit diagram (left side) illustrating the arrangement of the components within the illustrated region of the CMOS tier.

FIG. 10 shows another embodiment of a CMOS circuit component which may be formed to extend through several vertically-spaced decks of a CMOS tier, and specifically shows an example of a transmission pass gate 90. Such transmission pass gate may be coupled with integrated circuitry of one or more tiers vertically offset relative to the tier 12 (for instance, one or more of the tiers 14 described above with reference to FIGS. 1-3) utilizing an input (shown as "IN" in FIG. 10) and/or an output (shown as "OUT" in FIG. 10). The illustrated transmission pass gate utilizes three PMOS transistors (30a-c) in parallel and coupled with one NMOS transistor (32d). In other embodiments, an analogous transition pass gate may utilize a different ratio of PMOS transistors to NMOS transistors rather than the 3:1 ratio of FIG. 10.

FIG. 11 shows another embodiment of a CMOS circuit component, and specifically shows an example of a two-input NAND circuit 92. The inputs are labeled in the schematic diagram as being V1 and V2, and may be any suitable inputs.

The two-input NAND circuit of FIG. 11 comprises an equal number of PMOS transistors and NMOS transistors. FIG. 12 shows an alternative embodiment of a two-input NAND circuit 92 in which there are more PMOS transistors than NMOS transistors. Such may balance electrical draw across the PMOS transistors relative to the NMOS transistors and/or may balance other electrical properties across the PMOS transistors relative to the NMOS transistors. The illustrated circuit of FIG. 12 comprises six PMOS transistors and two NMOS transistors. In other embodiments, the ratio of PMOS transistors to NMOS transistors may be different than the 3:1 ratio shown in the embodiment of FIG. 12.

In some embodiments, each deck of a CMOS tier may be considered to be a module comprising a plurality of substantially identical transistors, and it is recognized that circuit components may be formed within the CMOS tier by providing parallel connections between horizontally-spaced transistors within a common module (i.e. deck), serial connections between vertically-spaced transistors in modules directly adjacent one another (i.e., forming connections between PMOS transistors in one deck and NMOS transistors in a directly adjacent deck), and/or serial connections between devices within the vertically-spaced decks which are not directly adjacent one another (i.e., by vertically shunting across one or more decks so that a connection they be made from a transistor above such one or more decks to another transistor below such one or more decks). The connections may be made utilizing any suitable methodology. Example methodology is described with reference to FIGS. 13-24.

Figure 13:
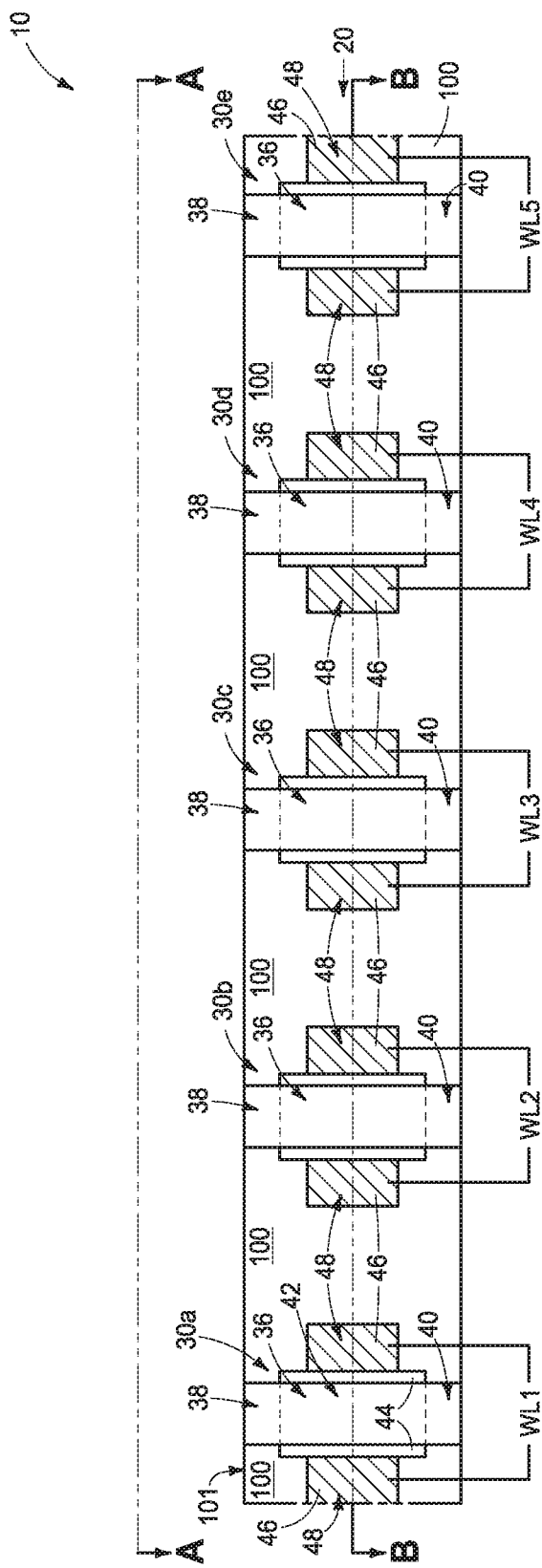
FIGS. 13-24 are diagrammatic cross-sectional side views of a region of an example construction at various example process stages of an example method for forming an example assembly comprising an example CMOS tier.

Referring to FIG. 13, an assembly 10 comprises a first deck 20 of a CMOS tier. The deck 20 comprises a plurality of first transistors 30*a-e*. The transistors may be substantially identical to one another, and may be all of a same transistor type; with such transistor type being either a p-channel type or an n-channel type. Accordingly, the transistors 30*a-e* may correspond to either the p-channel transistors of FIG. 4, or the n-channel transistors of FIG. 5.

Each of the transistors 30*a-e* comprises the vertically-extending semiconductor pillar 36 having a channel region 42 between upper and lower source/drain regions 38 and 40. Each of the transistors 30*a-e* also comprises the gate dielectric material 44 laterally along the channel region 42, and comprises the gate material 46 along the gate dielectric material 44 and laterally offset from the channel region 42 by the gate dielectric material. The gate material 46 is configured as transistor gates 48.

The first deck 20 may be formed with any suitable processing. In some embodiments, the transistors 30*a-e* are thin-film transistors (TFTs) formed utilizing low temperature processing (i.e., processing which does not exceed about 500° C.). In such embodiments, the deck 20 may be formed subsequent to the formation of an integrated circuit tier (for instance, one of the tiers 14 of FIGS. 1-3) without adversely affecting components within the integrated circuit tier. Of course, the deck 20 may also be formed prior to formation of an integrated circuit tier.

The transistors 30*a-e* are laterally spaced from one another by insulative material 100. Such insulative material may comprise any suitable composition or combination of compositions; such as, for example, one or more of the compositions discussed above relative to the insulative materials 57, 58 and 60 of FIGS. 4 and 5.

The construction 10 of FIG. 13 shown to have a planarized upper surface 101 extending across an upper surface of the insulative material 100 and across upper surfaces of the vertically-extending semiconductor pillars 36.

FIG. 13A shows a top view of the construction 10 of FIG. 13, and shows that the transistors 30*a-e* are part of an array 102; with such array comprising numerous other transistors in addition to the transistors 30*a-e*. The other transistors are labeled as transistors 30, and may be substantially identical to the transistors 30*a-e*. In the description that follows, all of the transistors of the array 102 may be referred to as transistors 30 in order to simplify a description of the array 102, or some of the transistors may be specifically referred to as transistors 30*a-e* if such is beneficial explaining aspects of the transistors or the array.

The array 102 may be considered to comprise rows and columns. In some embodiments, the rows may be considered to extend along a first direction represented by an axis 1, and the columns may be considered to extend along a second direction represented by an axis 2; with the second direction of axis 2 crossing the first direction of axis 1. In the illustrated embodiment, the axes 1 and 2 are substantially orthogonal to one another (with the term "substantially orthogonal" meaning orthogonal to within reasonable tolerances of fabrication and measurement).

A line C-C across FIG. 13A represents a position of the cross-sectional view of FIG. 13.

Figures 1, 13B:
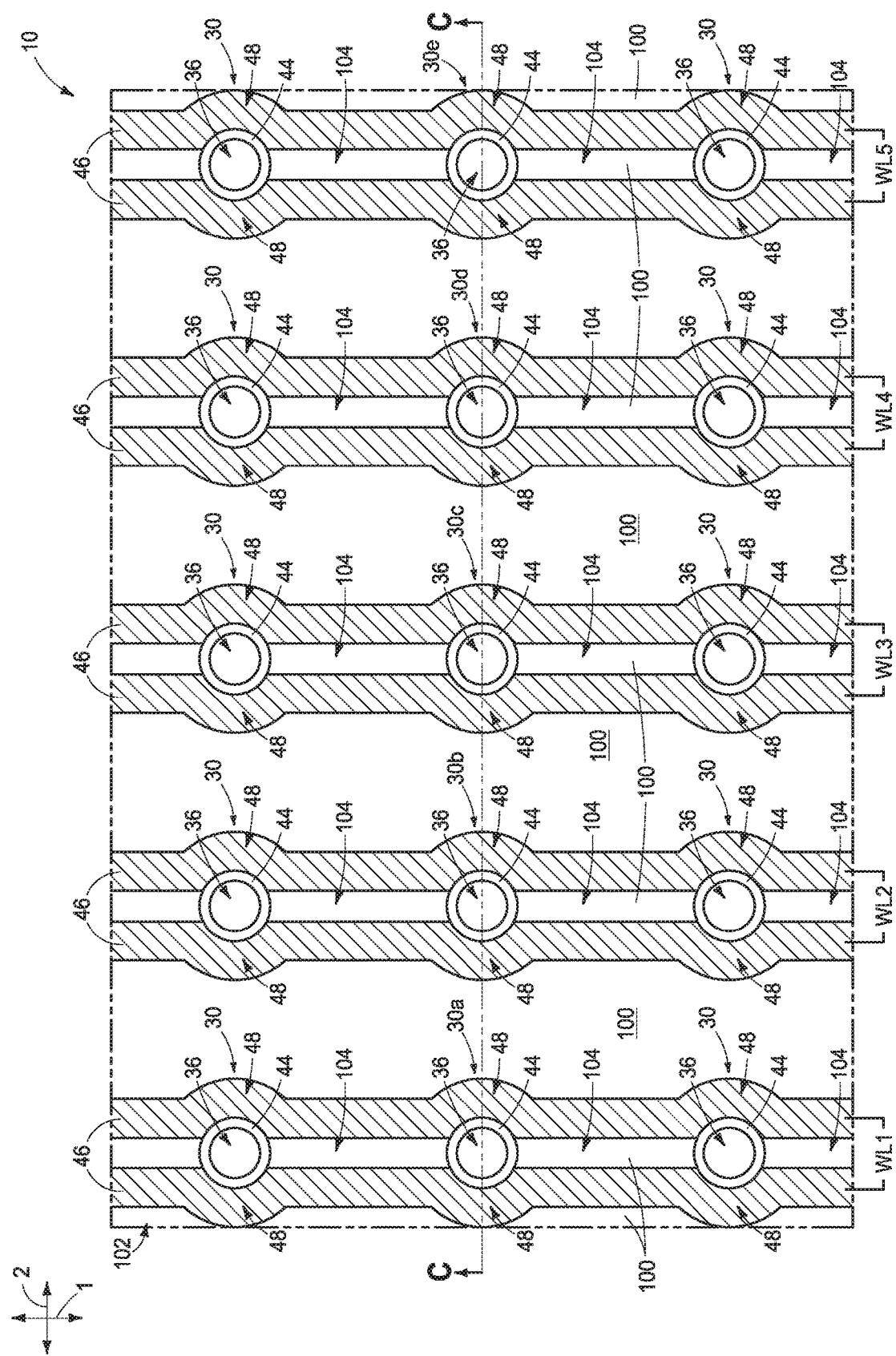
Figures 2, 13B:
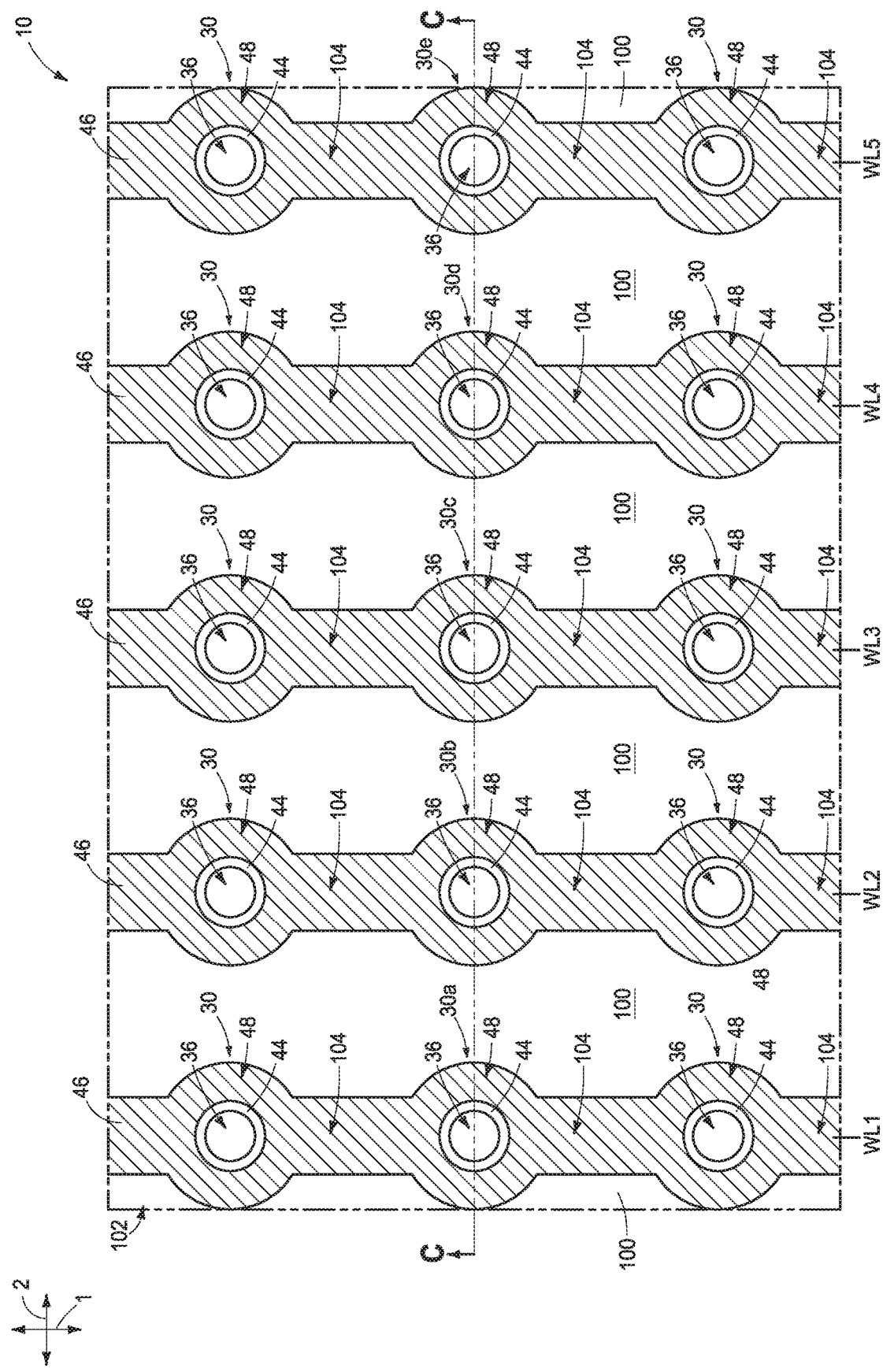

FIGS. 13B-1 and 13B-2 show views along the line B-B of FIG. 13 relative to a pair of alternative embodiments. FIGS. 13B-1 and 13B-2 show the gate material 46 configured as wordlines WL1-WL5; with such wordlines extending along the row direction of axis 1. In the embodiment of FIG. 13B-1, each of the wordlines WL1-WL5 comprises a pair of components which are spaced from one another by insulative material 100 in intervening regions 104 between the transistors 30 along the rows of the array 102. In contrast, the embodiment of FIG. 13B-2 shows the wordlines wrapping entirely around the pillars 36 of the transistors 30 and being single structures within the intervening regions 104. It may be desirable to utilize the embodiment of FIG. 13B-2 in some applications in that the wrapping of the gate material 44 entirely around the semiconductor pillars 36 may enable better coupling between the transistor gates 48 and the channel regions 42 of the transistors 30 than may be achieved when the gate material 46 only partially surrounds the second pillars 36. Alternatively, the embodiment of FIG. 13B-1 may be preferred in some applications if such embodiment is easier to fabricate than the embodiment of FIG. 13B-2.

Although the material 100 is shown within the intervening regions 104 in the embodiment of FIG. 13B-1, it is to be understood that in other embodiments a different insulative material may be provided within such intervening regions than the material 100.

Figure 14:
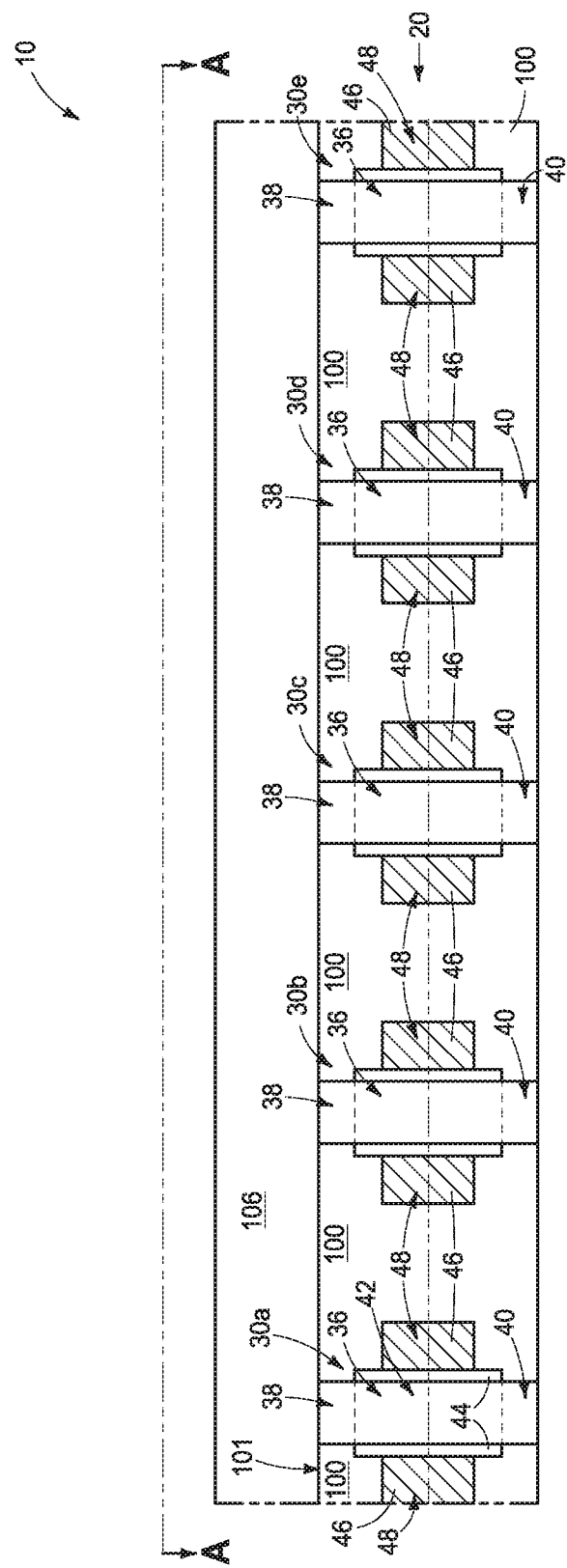
Figure 14A:
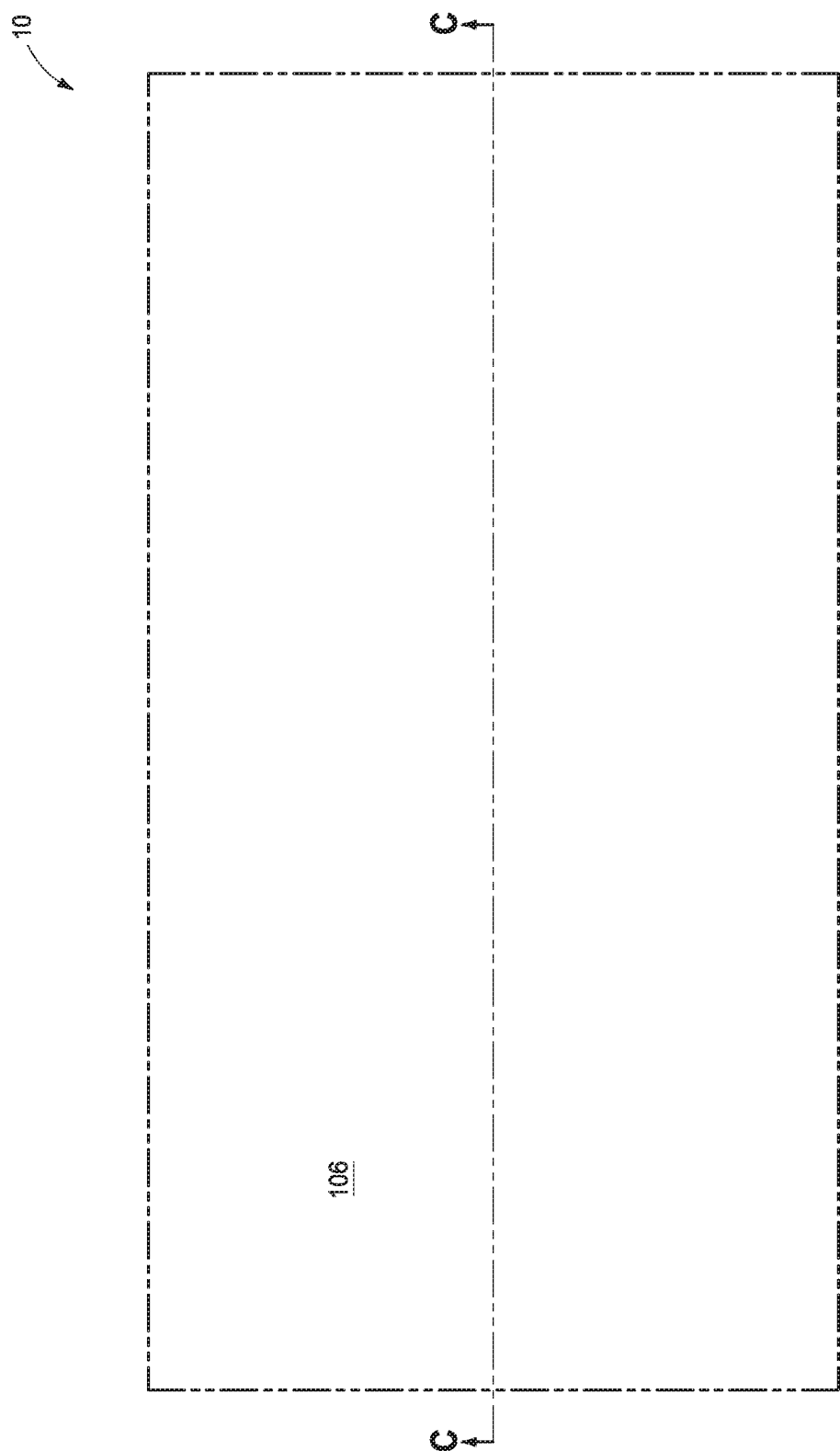

Referring to FIGS. 14 and 14A, masking material 106 is formed over the first deck 20, and specifically is formed along the planarized upper surface 101. The masking material 106 may comprise any suitable composition(s), and in some embodiments may comprise, consist essentially of, or consist of photoresist.

Figure 15:
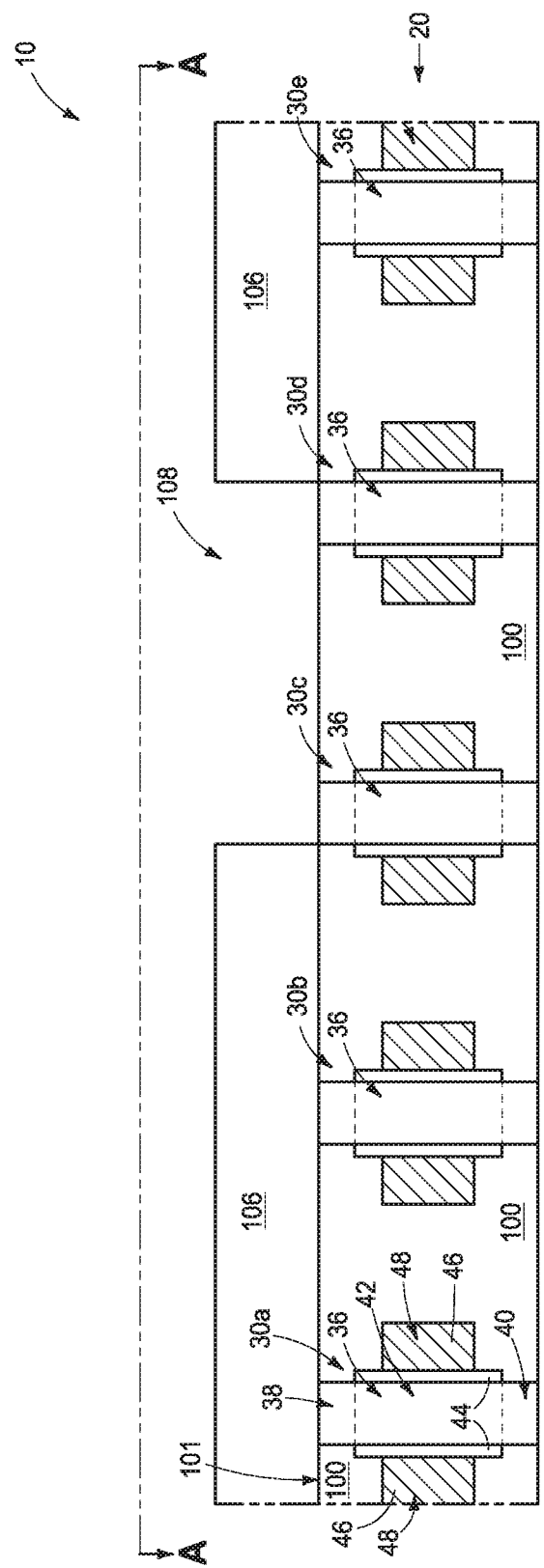
Figure 15A:
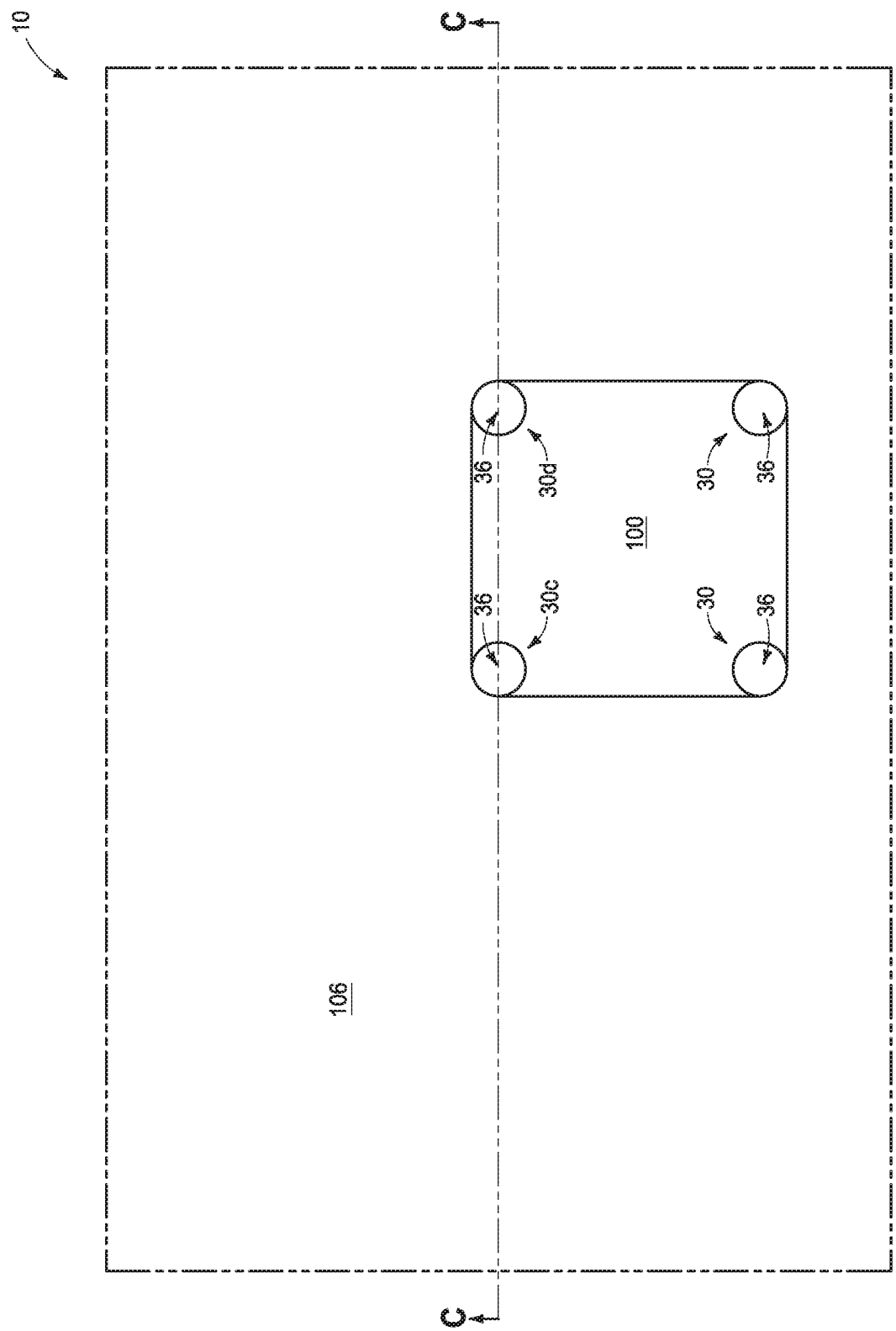

Referring to FIGS. 15 and 15A, the masking material 106 is patterned to expose upper surfaces of some of the semiconductor material pillars 36.

Figure 16:
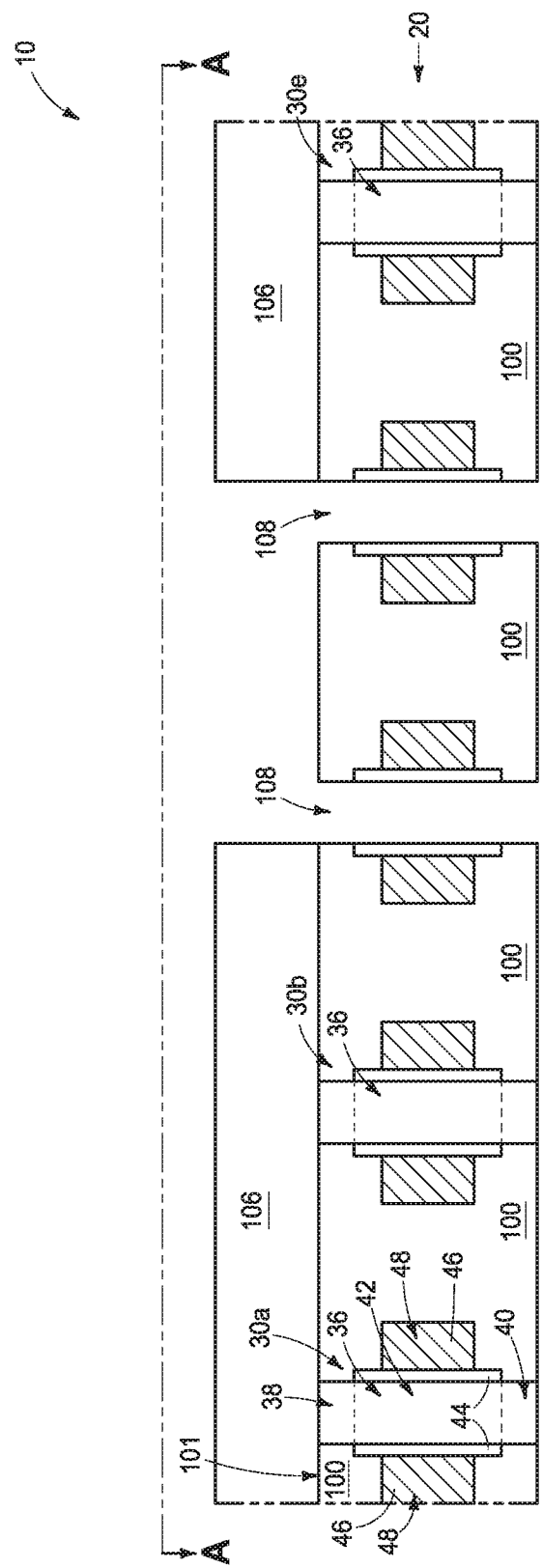
Figure 16A:
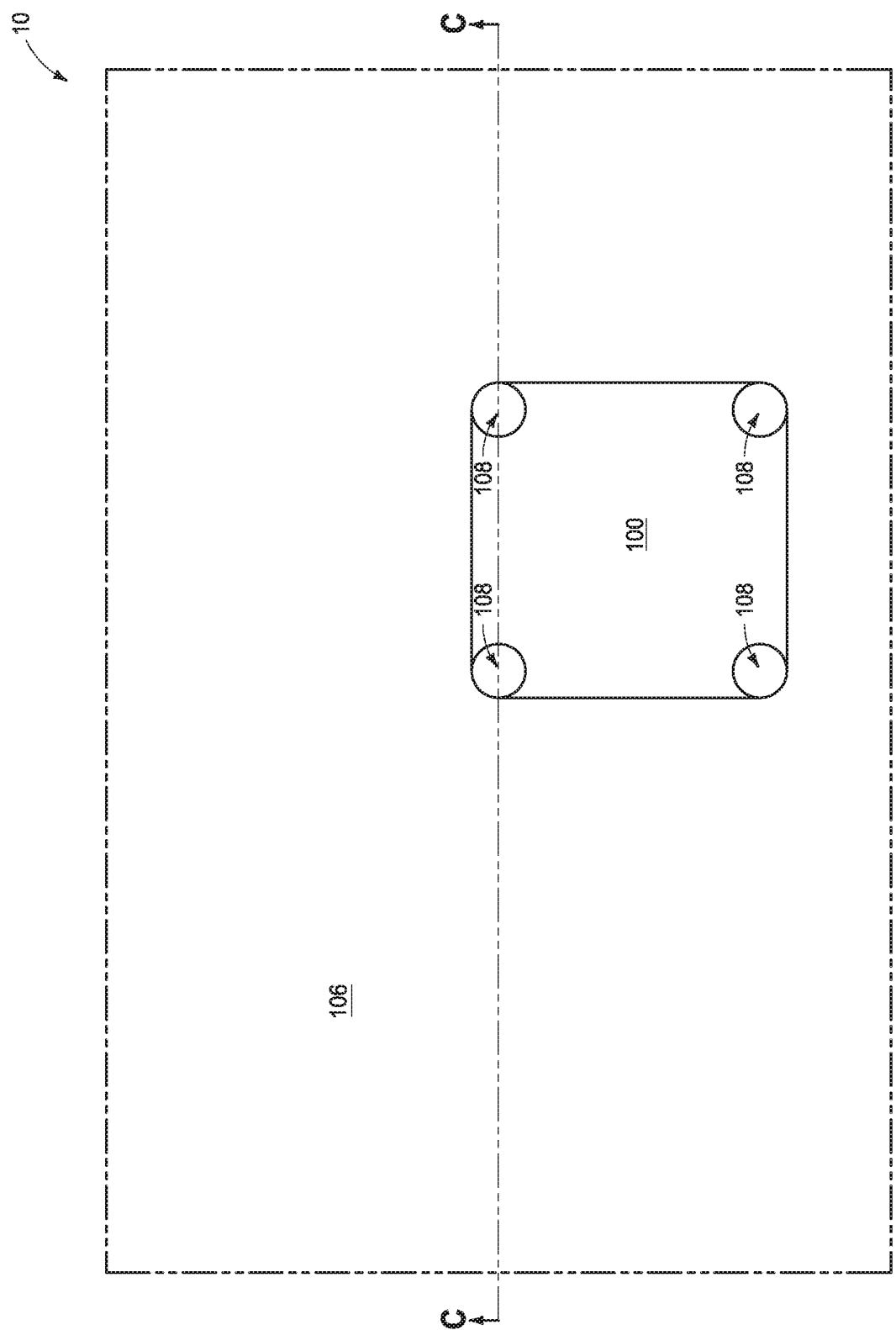

Referring to FIGS. 16 and 16A, the exposed semiconductor material pillars are removed to leave voids 108 extending through the deck 20. The voids 108 are in the locations where the semiconductor material pillars 36 had previously been. Once the semiconductor material pillars 36 are removed from within transistors 30*c* and 30*d* (with the transistors 30*c* and 30*d* being shown in FIG. 15), such transistors become other components and accordingly are no longer labeled as transistors 30*c* and 30*d*.

Figure 17:
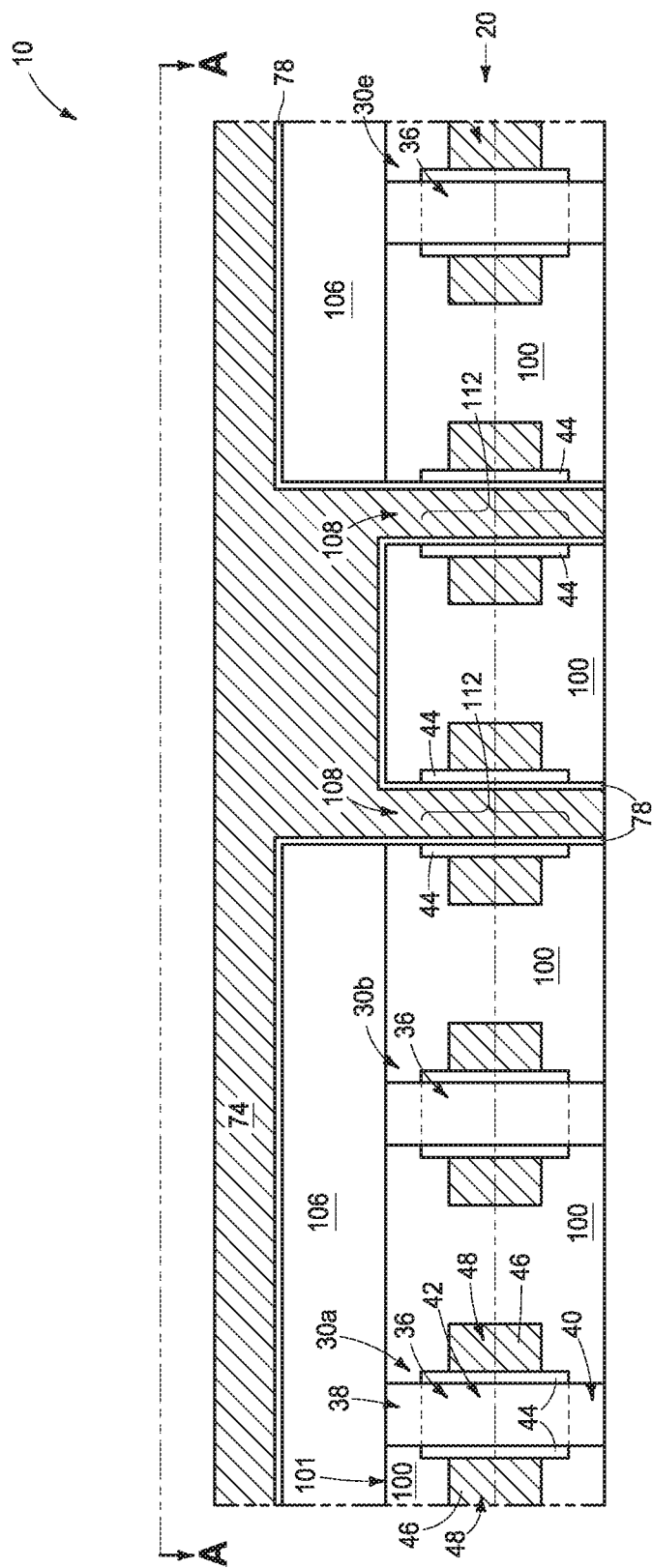
Figure 17A:
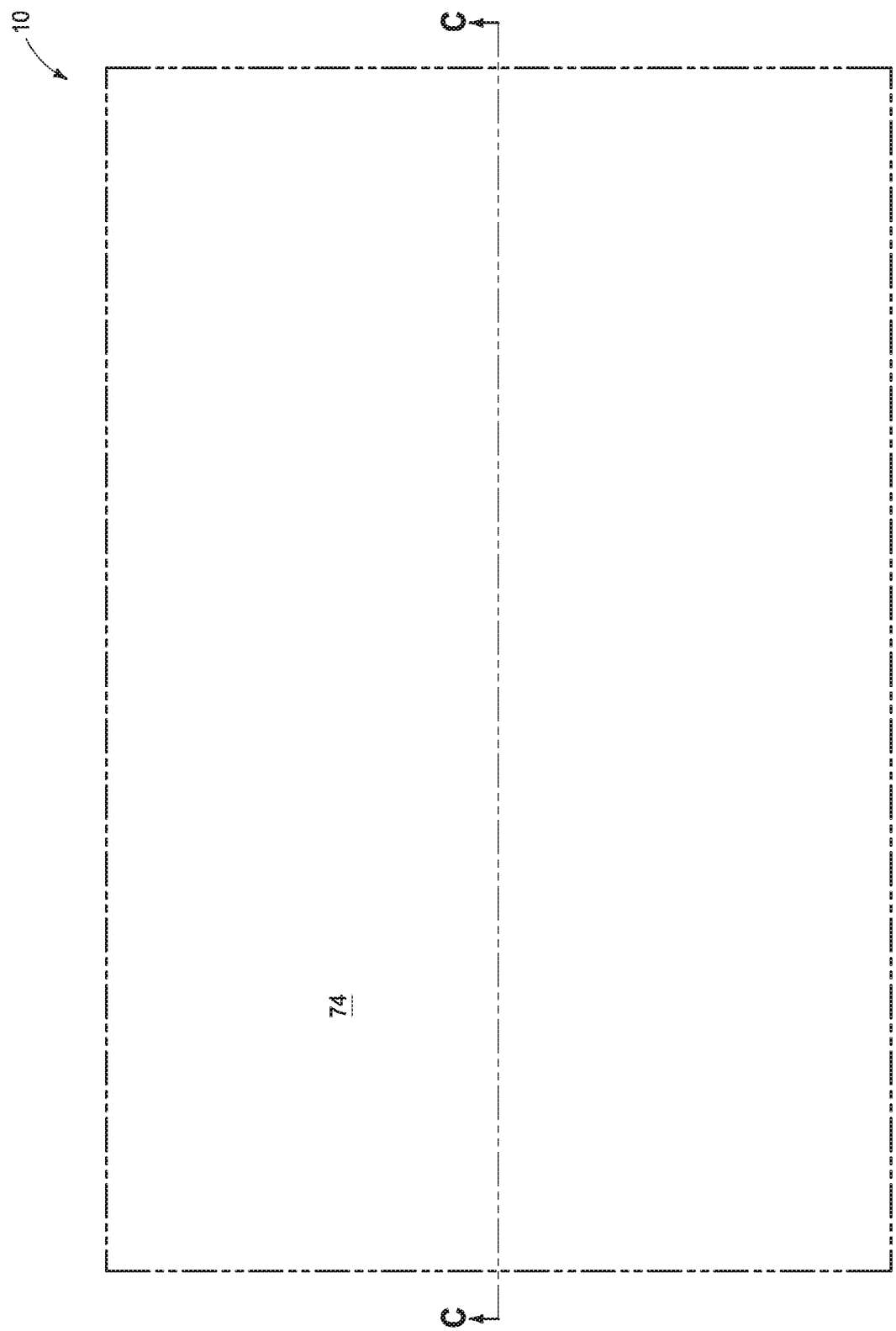

Referring to FIGS. 17 and 17A, conductive material 74 is formed across masking material 106 and within the voids 108. The conductive material 74 may comprise any of the compositions described above with reference to FIG. 7. In some embodiments, the conductive material 74 may be referred to as a first conductive material to distinguish it from another conductive material formed subsequent to the conductive material 74.

In the shown embodiment, the voids are lined with insulative material 78 prior to forming the conductive material 74 within such voids. The insulative material 78 may comprise any of the compositions described above with reference to FIG. 7. In some embodiments, the gate dielectric material 44 may be considered to be exposed along sections 112 of the voids 108. The insulative material 78 may be referred to as dielectric material, and may be considered to be additional dielectric material (i.e., additional to the gate dielectric material 44). The additional dielectric material 78 may be considered to be formed along the sections 112 of the voids 108 to narrow such sections of the voids.

The insulative material 78 is optional, and in some embodiments may be omitted; with example considerations for determining whether or not to include material 78 being discussed above with reference to FIG. 7.

Figure 18:
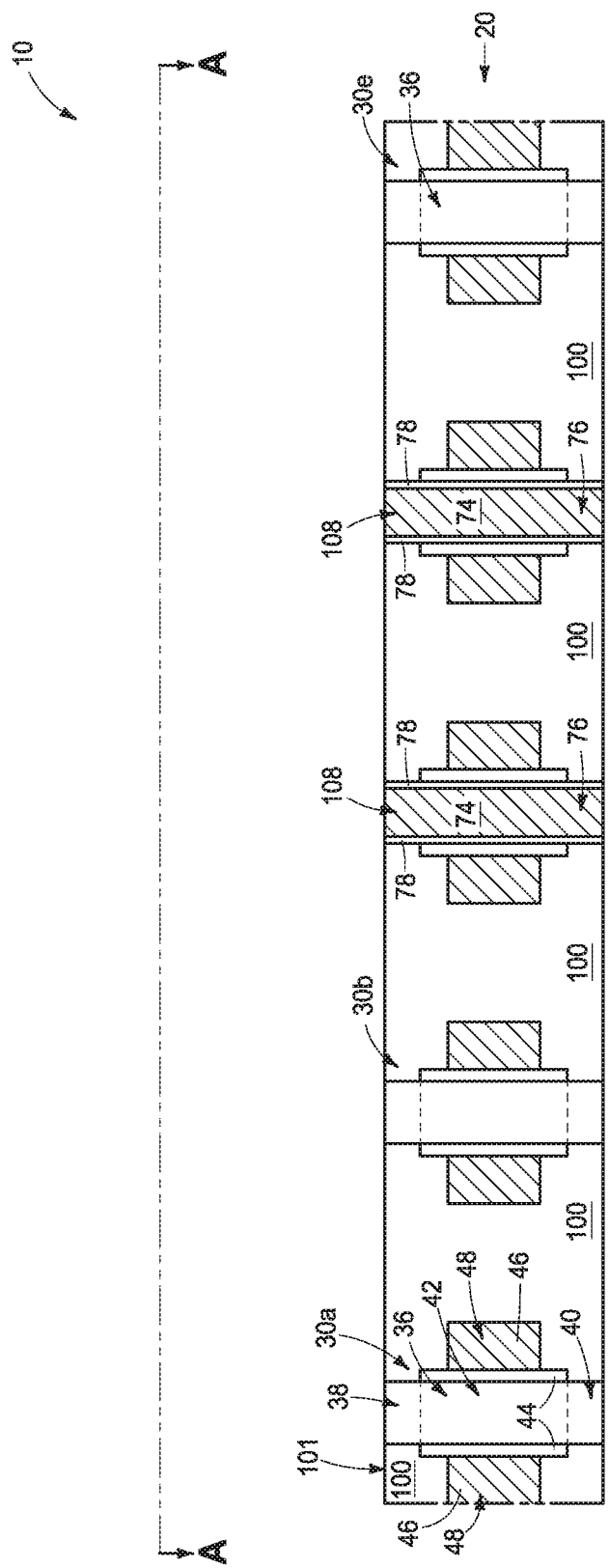
Figure 18A:
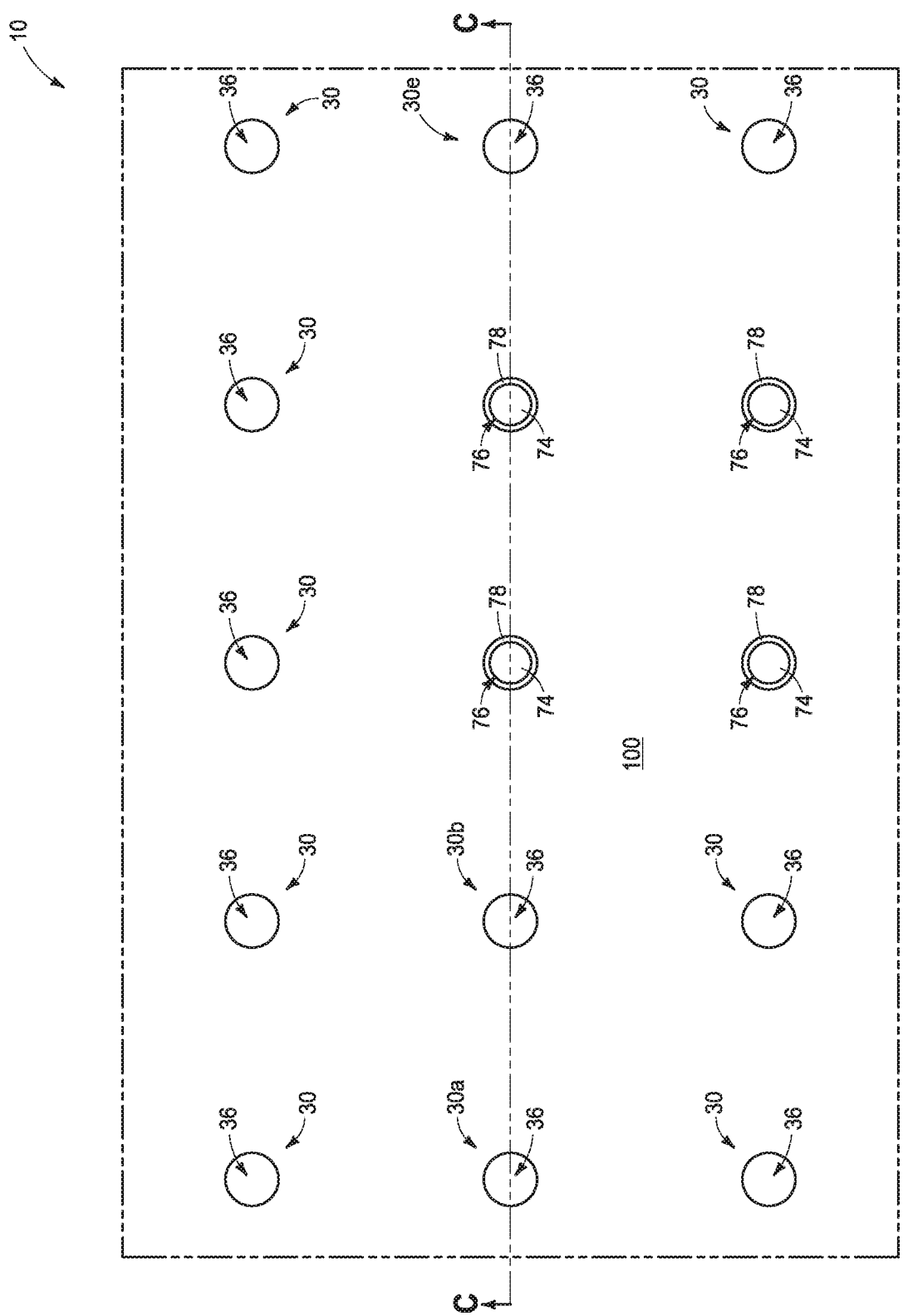

Referring to FIGS. 18 and 18A, materials 74, 78 and 106 are removed from over surface 101. Such removal may comprise any suitable processing, such as, for example, planarization (e.g., chemical-mechanical polishing, [CMP]). The conductive material 74 remaining within voids 108 becomes the conductive interconnects 76, with such conductive interconnects extending through the deck 20. In some embodiments, the conductive interconnects 76 may be referred to as first conductive interconnects to distinguish them from other conductive interconnects formed at later process stages.

Figure 19:
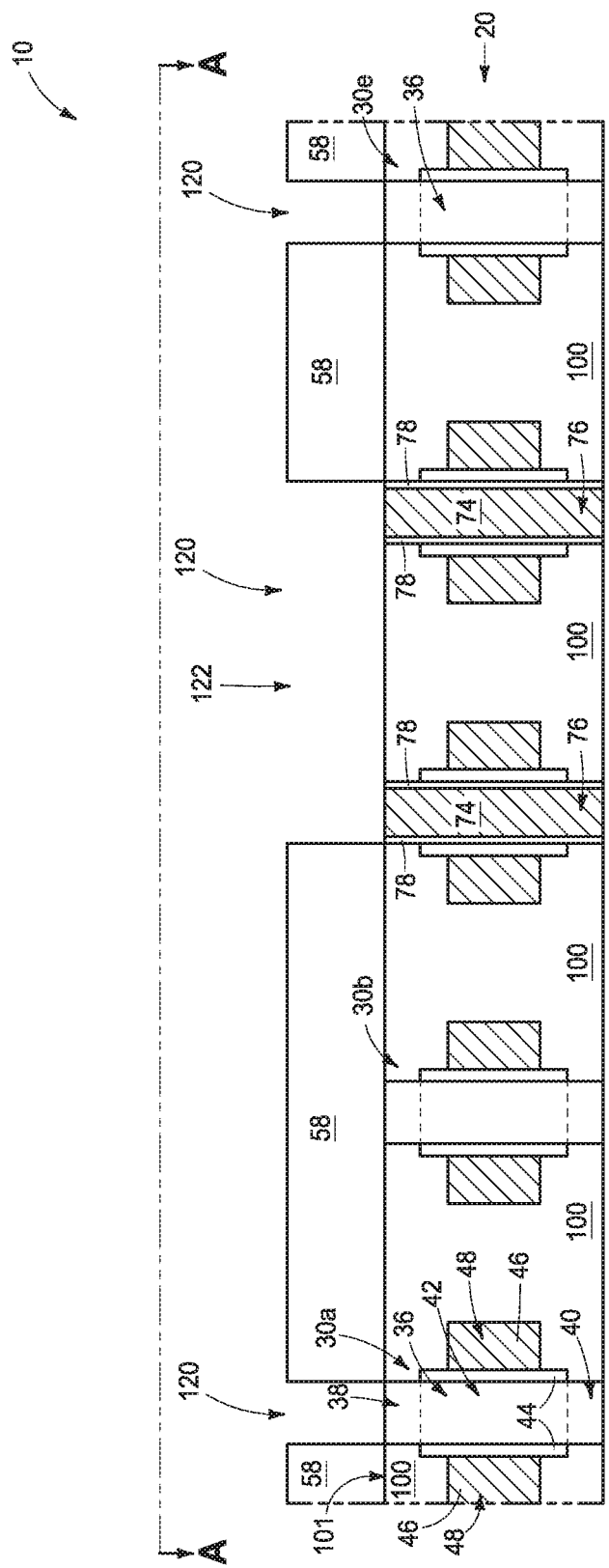
Figure 19A:
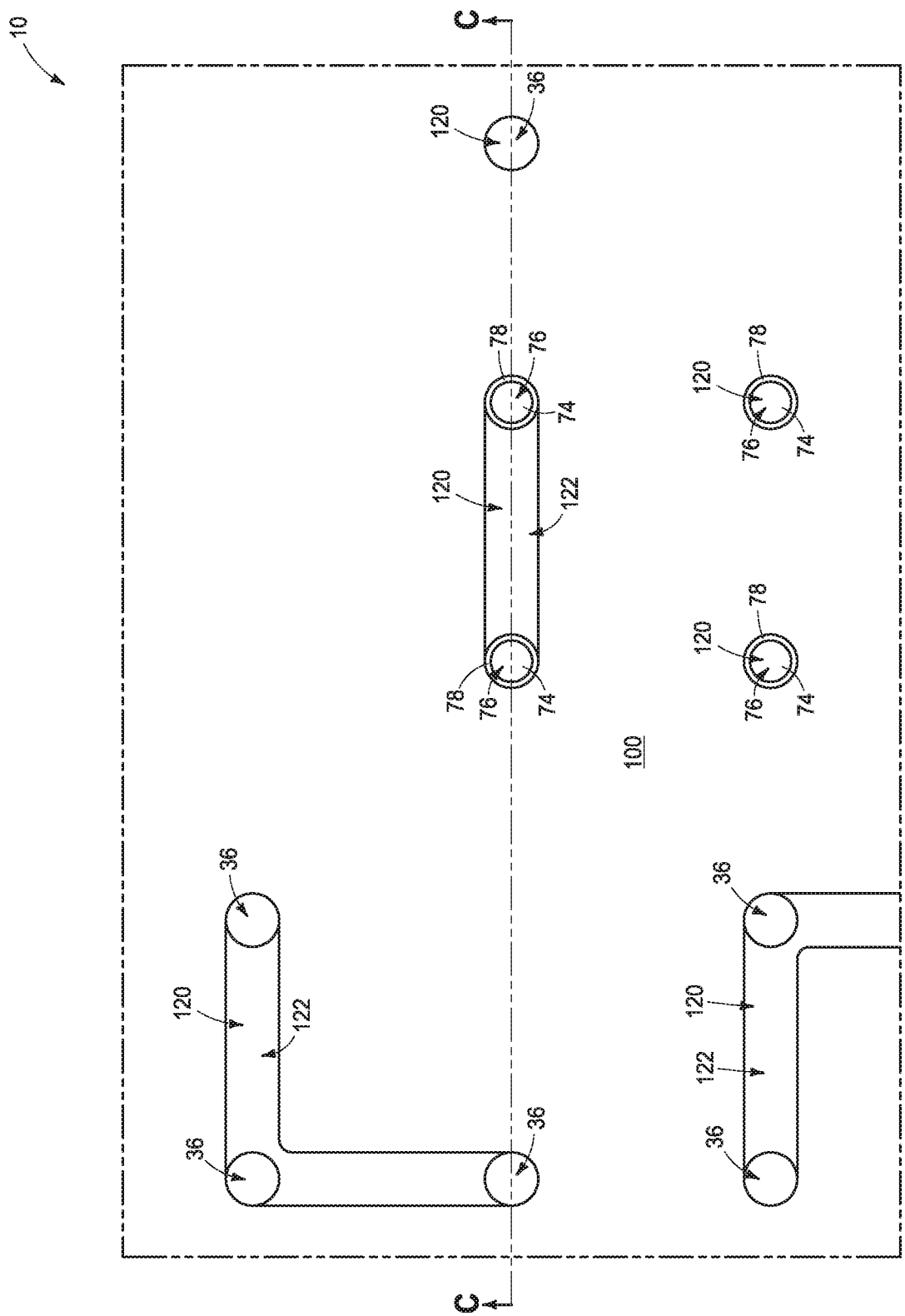

Referring to FIGS. 19 and 19A, insulative material 58 is formed across the upper surface 101 of deck 20 and patterned to have openings 120 extending therethrough. In some embodiments, the insulative material 58 may be considered to be an insulative region formed over the deck 20. The openings 120 expose locations of some of the vertically-extending semiconductor pillars 36 of the array 102 of FIG. 13A. At the processing stage of FIGS. 19 and 19A some of such locations still retain semiconductor pillars 36, and some have conductive interconnects 76. The pillars 36 and interconnects 76 present at the processing stage of FIGS. 19 and 19A may be generically referred to as vertically-extending structures 36/76.

Some of the openings 120 include trenches 122 which extend between two or more of the vertically-extending structures 36/76.

Figure 20:
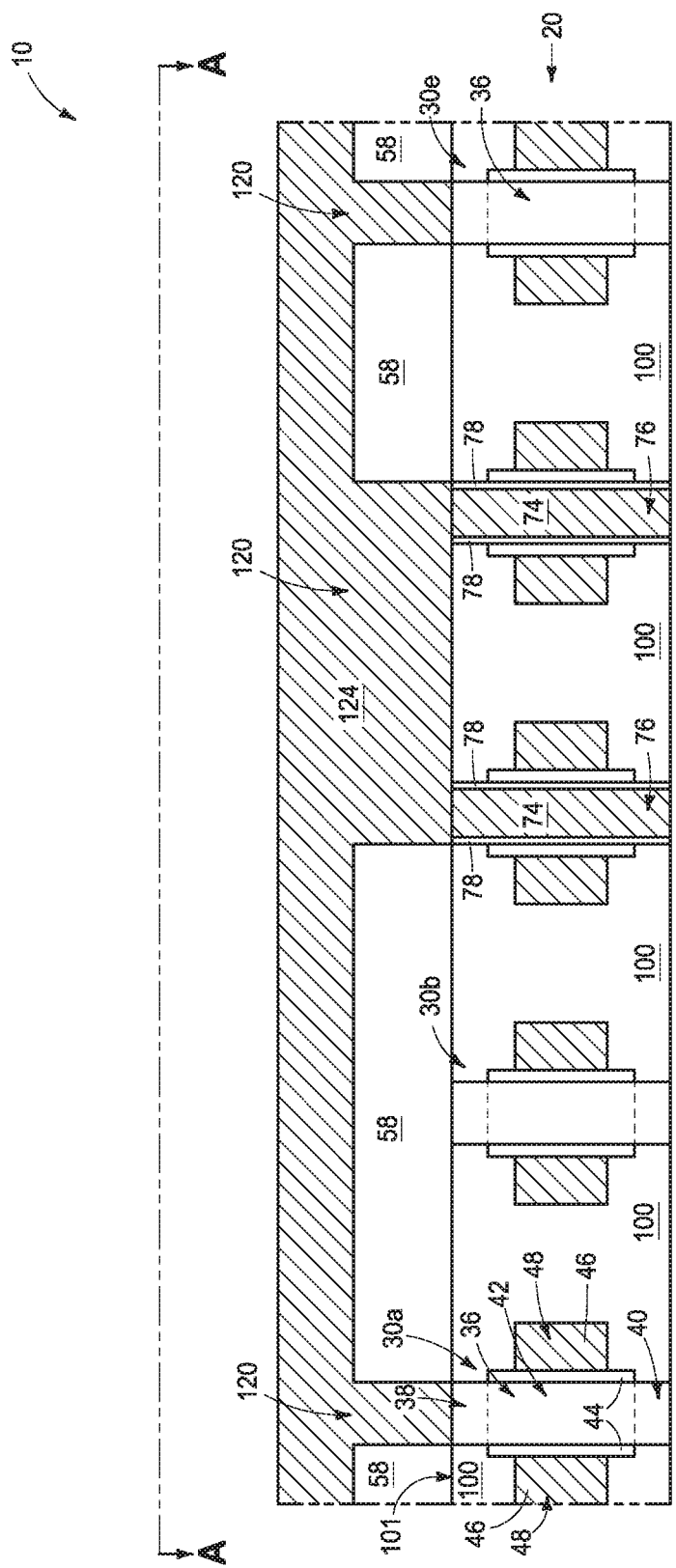
Figure 20A:
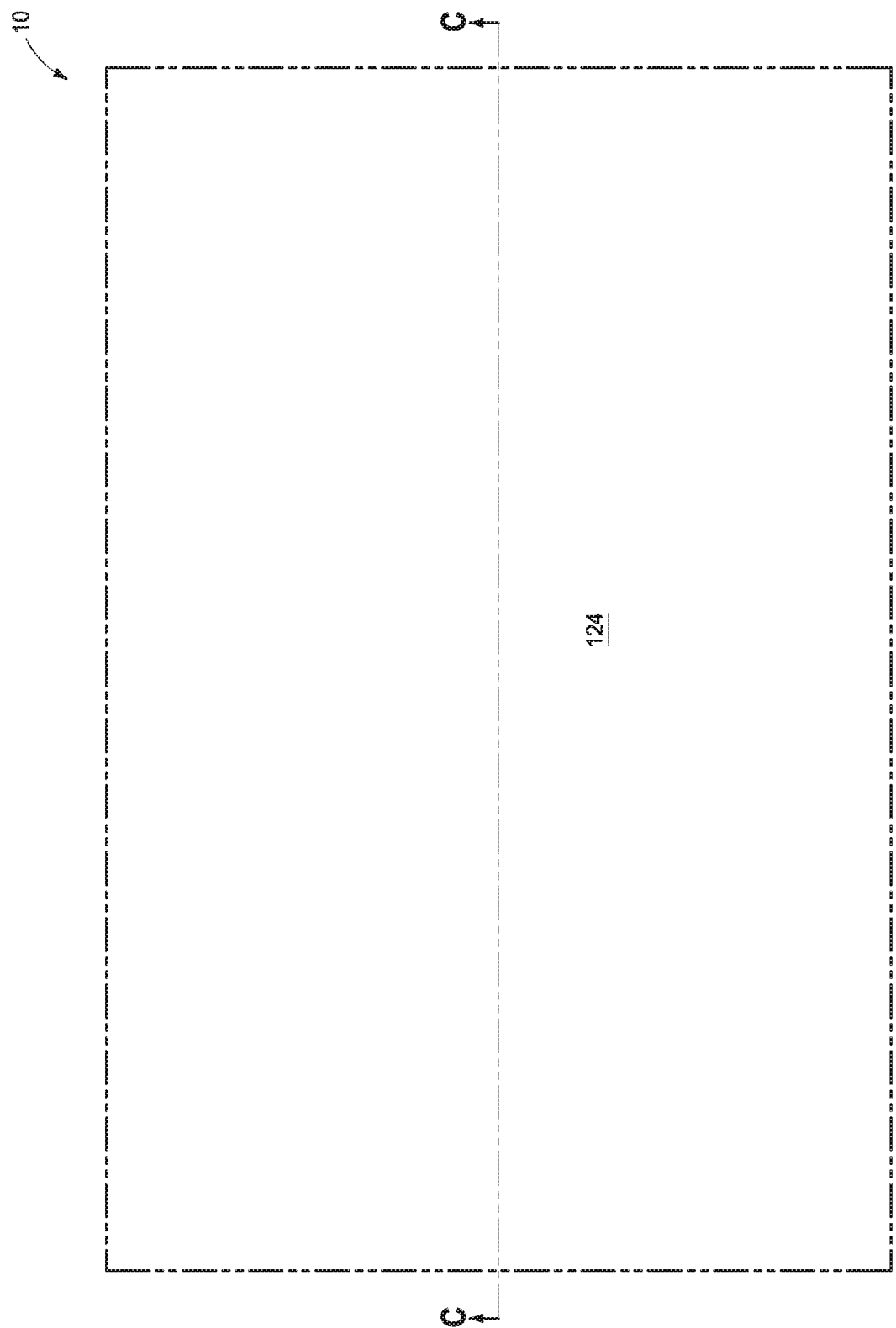

Referring to FIGS. 20 and 20A, conductive material 124 is formed over the insulative material 58 and within the openings 120. Conductive material 124 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In some embodiments, the conductive material 124 may be referred to as a second conductive material to distinguish it from the first conductive material 74. The first and second conductive materials 74 and 124 may comprise a same composition as one another in some embodiments, and may comprise different compositions relative to one another in other embodiments.

Figure 21:
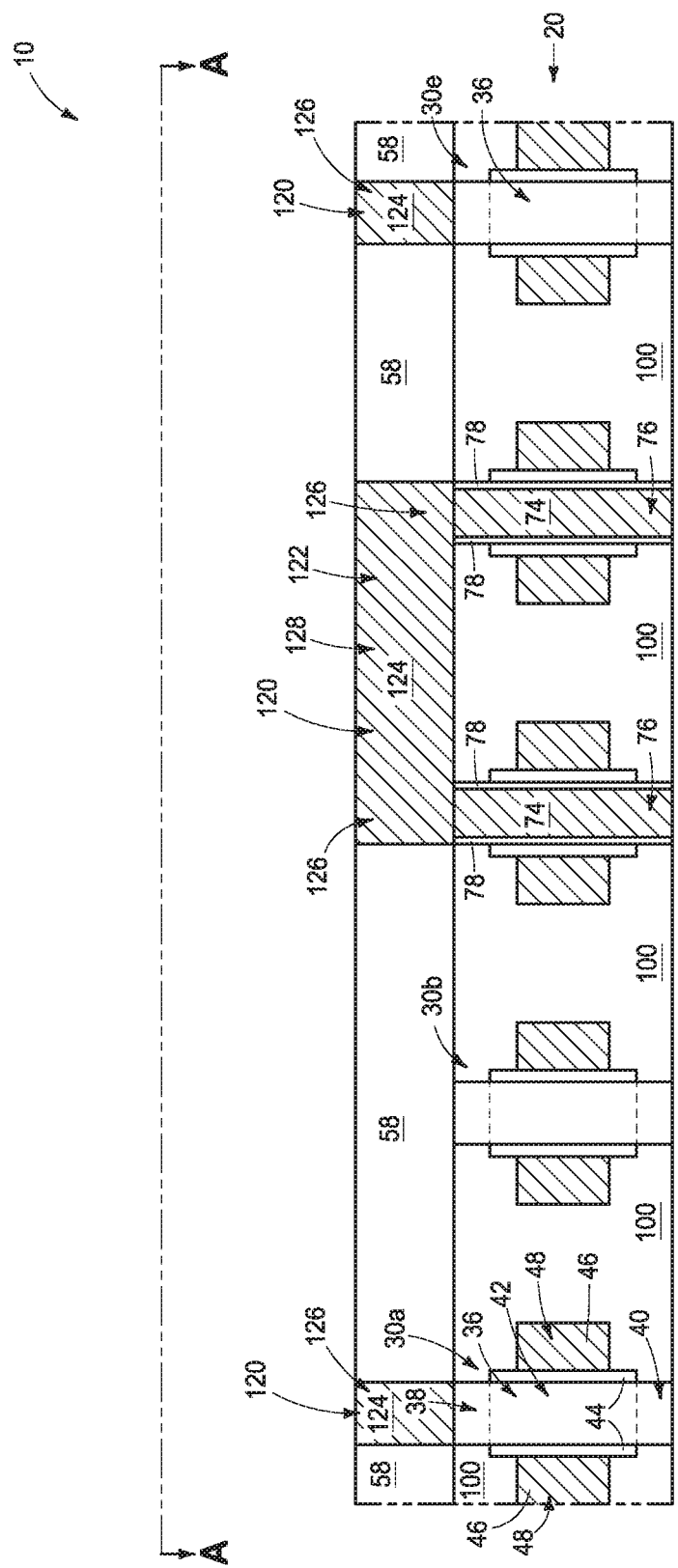
Figure 21A:
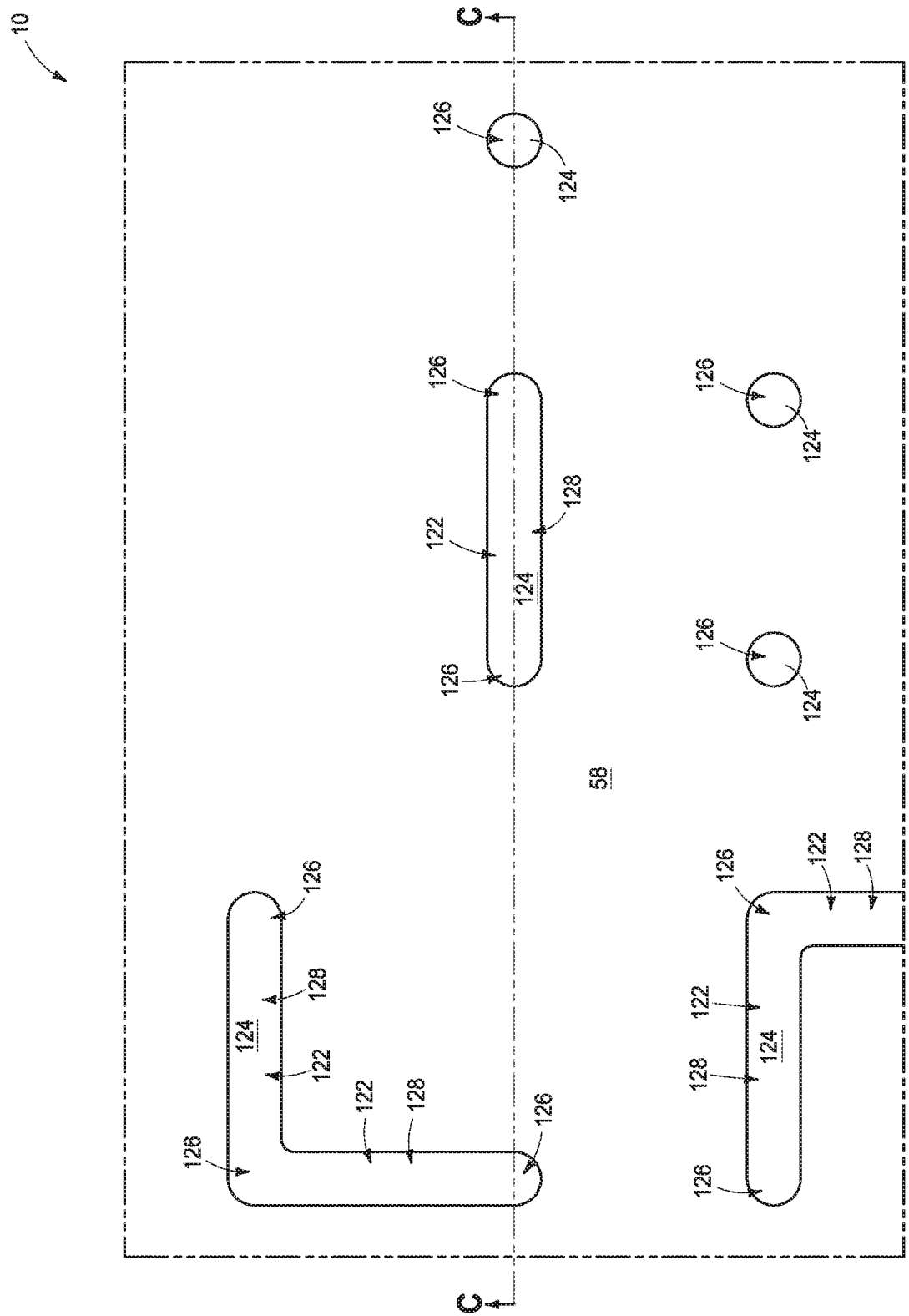

Referring to FIGS. 21 and 21A, material 124 is removed from over insulative material 58, while leaving the material 124 within the openings 120. Such patterns the material 124 into a plurality of interconnects 126, which may be analogous to the interconnect 64 described above with reference to FIG. 6. In some embodiments, the interconnects 126 may be referred to as second interconnects to distinguish them from the first interconnects 76.

In some embodiments, it is only the material 124 directly over the vertically-extending structures 36/76 which corresponds to the interconnects 126. Other portions of the material 124 are segments 128 within the trenches 122; with such segments extending between interconnects 126. The segments 128 may be considered to be wiring which couples some of the interconnects 126 to one another. In some embodiments, such wiring may be utilized to electrically couple two or more vertically-extending segments 36/76 within the same deck as one another in a parallel configuration; such as, for example, one or more of the parallel configurations described above with reference to FIGS. 9-12.

Figure 22:
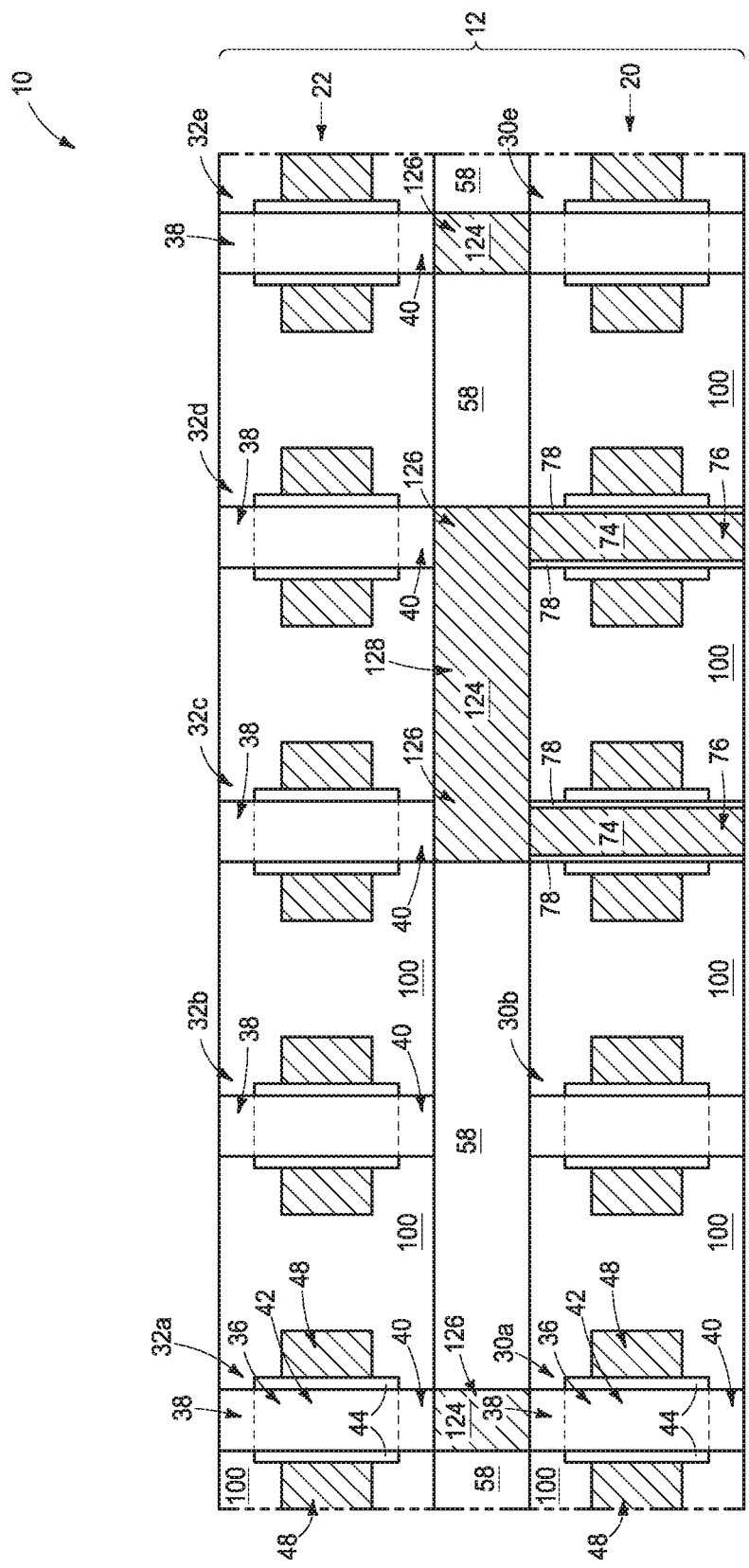

Referring to FIG. 22, the second deck 22 is formed over the first deck 20; with the first and second decks being comprised by a CMOS tier 12.

The second deck 22 comprises a plurality of second transistors 32*a-e*. The transistors 32*a-e* may be substantially identical to one another, and may be all of a same transistor type; with such transistor type being either a p-channel type or an n-channel type. Accordingly, the transistors 32*a-e* may correspond to either the n-channel transistors of FIG. 4, or the p-channel transistors of FIG. 5. The second transistors 32*a-e* are of a different transistor type than the first transistors 30*a-c* (i.e., if the first transistors 30*a-e* are p-channel type transistors, then the second transistors 32*a-e* are n-channel type transistors; or vice versa).

Each of the second transistors 32*a-e* comprises the vertically-extending semiconductor pillar 36 having a channel region 42 between upper and lower source/drain regions 38 and 40. Each of the transistors 32*a-e* also comprises the gate dielectric material 44 laterally along the channel region 42; and comprises the transistor gates 48 along the channel regions 42, and spaced from such channel regions by the gate dielectric material 44. The transistors 32*a-e* are laterally spaced from one another by insulative material 100.

The second deck 22 is over the insulative material 58. In the shown embodiment, the transistors 32*c*, 32*d* and 32*e* have bottom source/drain regions 40 coupled with conductive interconnects 126. Further, the transistors 32*c* and 32*d* are coupled in parallel with one another through the wiring 128.

The second deck 22 may be formed with any suitable processing, including, for example, low-temperature processing.

Figure 23:
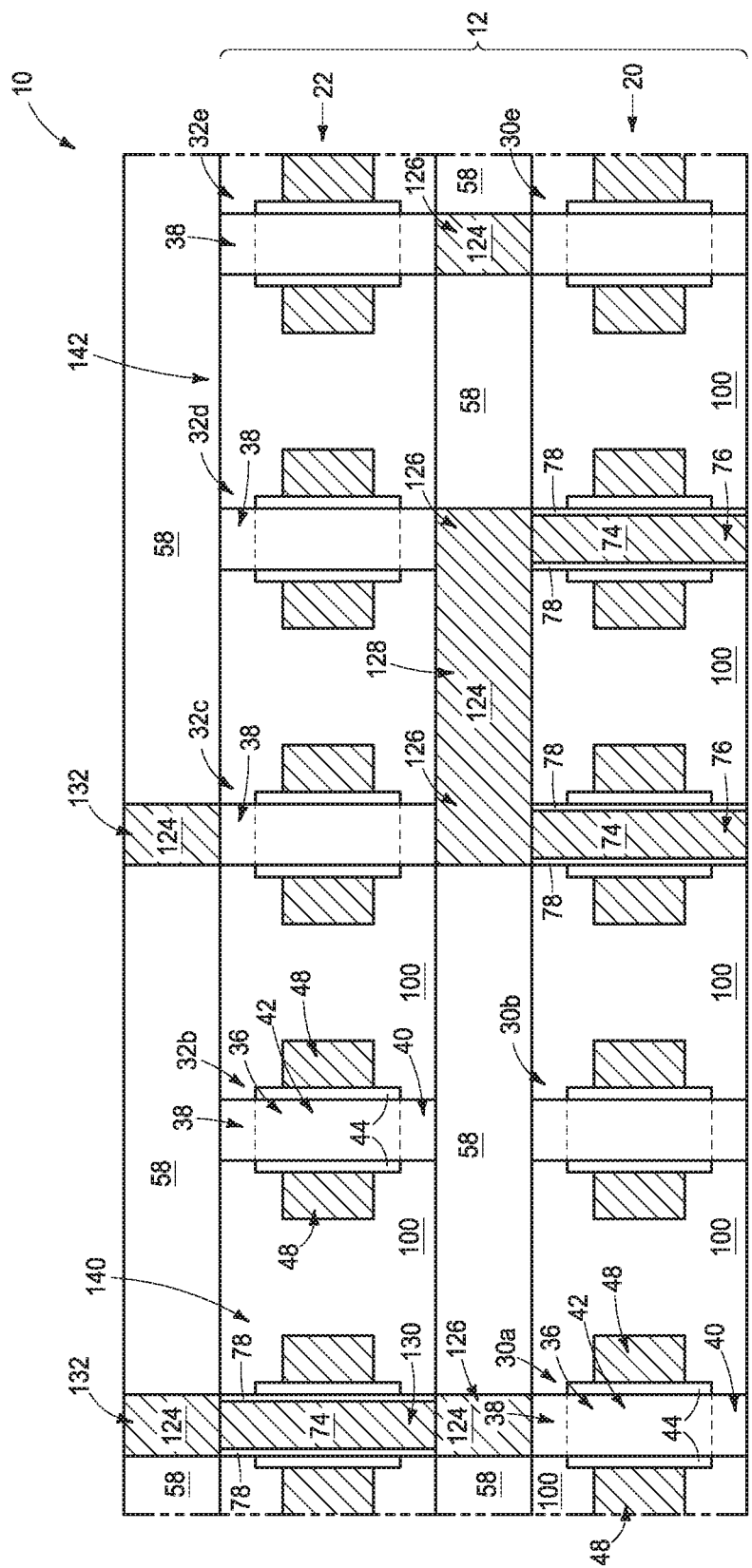

Referring to FIG. 23, the second transistor 32*a* (FIG. 22) is replaced with a vertical interconnect 130 analogous to the interconnects 76 associated with the lower deck 20. Insulative material 58 is formed over the second deck 22, and interconnects 132 are formed to extend through the insulative material 58 to the vertical interconnect 130, and to an upper source/drain region 38 of the transistor 32*c*. In the shown embodiment, the interconnect 130 of the upper deck 22 comprises a same material 74 as the interconnects 76 within the lower deck 20, and the interconnects 132 immediately above the upper deck 22 comprise a same material 124 as the interconnects 126 immediately above the lower deck 20. In other embodiments, the interconnect 130 may comprise a different material than the interconnects 76 and/or the interconnects 132 may comprise a different material than the interconnects 126. Regardless, the interconnects 130 and 132 associated with the upper deck 22 may be formed with processing analogous to, or identical to, the processing described above for fabricating the interconnects 76 and 126 associated with the lower deck 20.

The interconnects 132 may be correspond to the interconnects 62 of FIGS. 6-12 in some embodiments.

The CMOS tier 12 of FIG. 23 is shown to comprise two decks 20 and 22. Such may correspond to a fully-fabricated CMOS tier in some applications. In other applications, additional decks may be formed over the illustrated decks utilizing processing analogous to that described for fabrication of decks 20 and 22.

In some embodiments, the processing of FIGS. 13-23 may be utilized to build CMOS circuit components identical to, or analogous to, the components described above with reference to FIGS. 6-12. In some embodiments, the interconnects 130 and 76 of FIG. 23, together with the transistors 30a and 32c-e coupled with such interconnects, may be considered to be incorporated into (i.e., comprised by) one or more CMOS circuit components. In the illustrated embodiment, the interconnect 130 and transistor 30a are shown to be comprised by a first CMOS circuit component 140; and the interconnects 76 and transistors 32c-d are shown to be comprised by a second CMOS circuit component 142.

Figure 24:
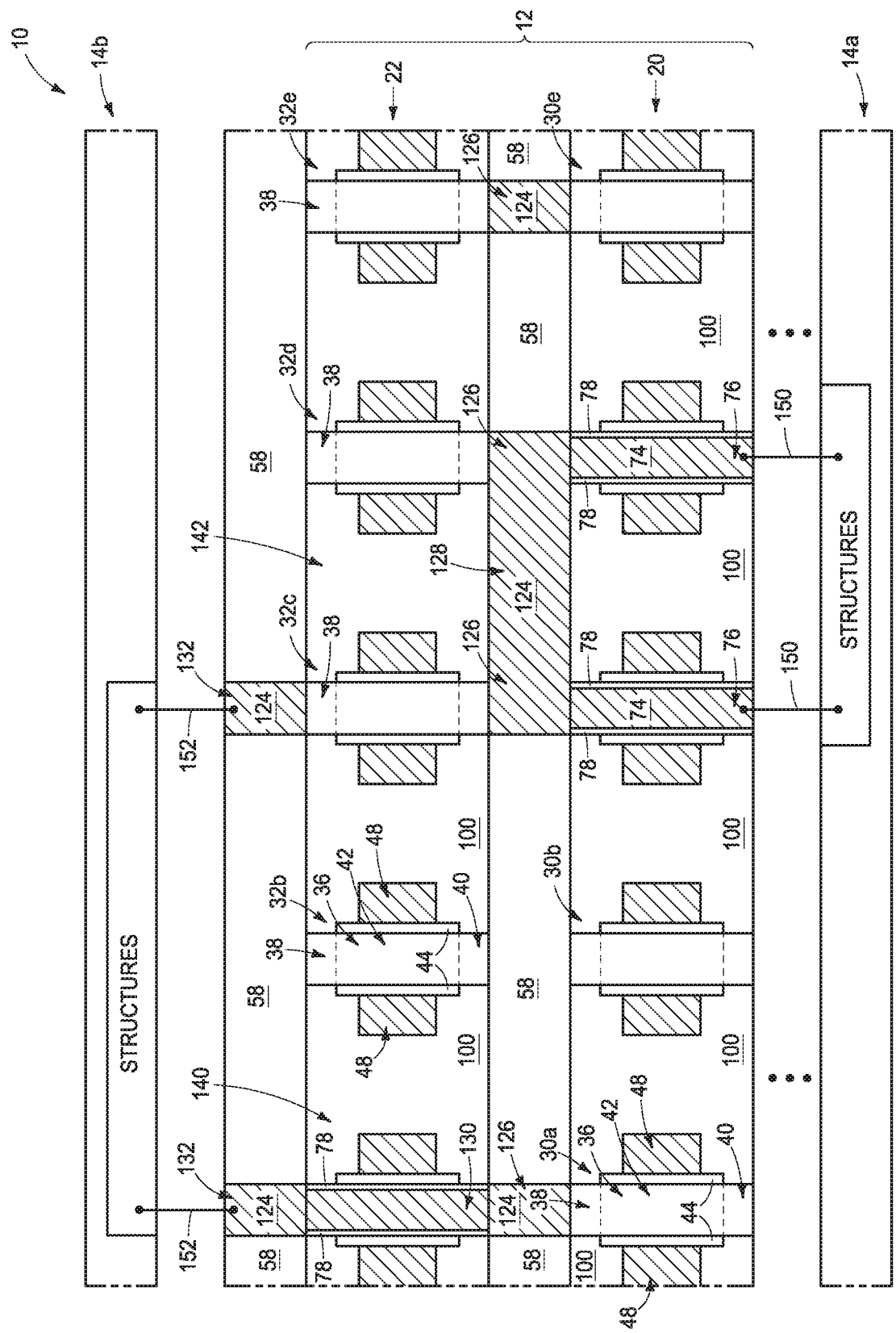

Referring to FIG. 24, the CMOS tier 12 is shown to be provided in a configuration in which the CMOS tier is over a first integrated device tier 14a and under a second integrated device tier 14b (i.e., is vertically between the first and second integrated device tiers 14a and 14b). The configuration of FIG. 24 may be fabricated by first forming the integrated device tier 14a, then forming the CMOS tier 12 over the integrated device tier 14a, and finally forming the integrated device tier 14b over the CMOS tier 12.

The CMOS tier 12 is shown to be coupled with one or more structures of the integrated device tier 14a through wiring 150 extending from the interconnects 76 to structures associated with the integrated device tier 14a. In some embodiments, the integrated device tier 14a may comprise memory/storage, and the wiring 150 may be coupled with wordlines and/or digit lines associated with such memory/storage.

The CMOS tier 12 is shown to be coupled with one or more structures of the integrated device tier 14b through wiring 152 coupled with the interconnect 130 and the transistor 32c. In some embodiments, the integrated device tier 14b may comprise memory/storage, and the wiring 152 may be coupled with wordlines and/or digit lines associated with such memory/storage. As another example, the integrated device tier 14b may comprise arrays of sensors, and the wiring 152 may be coupled with circuitry which extends to such array of sensors.

The assemblies discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "integrated device tier" and integrated circuit [ry] tier are both utilized herein. An integrated circuit[ry] tier is to be understood to be an example/species of an integrated device tier.

FIGS. 4-12 show source/drain regions labeled as "n" and "p" to indicate that the regions are either n-type or p-type. A PMOS deck will generally have p-type source/drain regions, and an NMOS deck will generally have n-type source/drain regions. Also, the body material of a PMOS deck will generally be n-type semiconductor material, and the body material of an NMOS deck will generally be p-type semiconductor material.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an assembly having a CMOS tier. The CMOS tier includes a PMOS deck and an NMOS deck, with the decks being vertically offset relative to one another. The PMOS deck includes a plurality of p-channel transistors which are substantially identical to one another, and the NMOS deck includes a plurality of n-channel transistors which are substantially identical to one another. An insulative region is between the PMOS deck and the NMOS deck. The CMOS tier has one or more circuit components which include one or more of the n-channel transistors coupled with one or more of the p-channel transistors through one or more conductive interconnects extending through the insulative region.

Some embodiments include an assembly comprising a CMOS tier having a first deck, a second deck and a third deck. The first deck comprises a plurality of first transistors which are substantially identical to one another. The second deck is above the first deck, and comprises a plurality of second transistors which are substantially identical to one another. The third deck is above the second deck and comprises a plurality of third transistors which are substantially identical to one another. A first insulative region is between the first deck and the second deck, and a second insulative region is between the second deck and the third deck. The first and third decks comprise a first transistor type, and the second deck comprises a second transistor type; with one of the first and second transistor types being a p-channel type, and the other of the first and second transistor types being an n-channel type. One or more first conductive interconnects extend through the first insulative region to couple one or more of the second transistors with one or more of the first transistors. One or more second conductive interconnects extend through the second insulative region to couple one or more of the third transistors with one or more of the second transistors. The CMOS tier has one or more circuit components which include at least one second transistor and one or both of a first transistor and a third transistor.

Some embodiments include a method of forming a CMOS tier. A first deck is formed to comprise a plurality of first transistors which are substantially identical to one another. Each of the first transistors comprises a vertically-extending semiconductor pillar which includes a channel region between an upper source/drain region and a lower source/drain region, which includes gate dielectric material laterally along the channel region, and which includes gate material along the gate dielectric material and laterally offset from the channel region by the gate dielectric material. An insulative region is formed over the first deck. An opening is patterned to extend through the insulative region to a location of one of the vertically-extending semiconductor pillars of the first transistors. Conductive material is formed within the opening to form a conductive interconnect. A second deck is formed over the insulative region. The second deck comprises a plurality of second transistors which are substantially identical to one another. One of the second transistors has a source/drain region coupled with the conductive interconnect. The first deck comprises a first transistor type, and the second deck comprises a second transistor type; with one of the first and second transistor types being a p-channel type, and the other of the first and second transistor types being an n-channel type.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An assembly comprising a CMOS tier, the CMOS tier comprising:
   a PMOS deck, the PMOS deck comprising a plurality of p-channel transistors which are substantially identical to one another;
   an NMOS deck comprising a plurality of n-channel transistors which are substantially identical to one another; the NMOS deck being vertically offset relative to the PMOS deck;
   an insulative region between the PMOS deck and the NMOS deck; and
   the CMOS tier having one or more circuit components which include one or more of the n-channel transistors coupled with one or more of the p-channel transistors through one or more conductive interconnects extending through the insulative region, the one or more conductive interconnects comprising at least one region configured as an individual vertically-extending post that is in direct physical contact with a first source/drain region comprised by one of the n-channel transistors and in direct physical contact with a second source/drain region comprised by one of the p-channel transistors.

2. The assembly of claim 1 wherein the PMOS deck is a first PMOS deck; wherein the p-channel transistors are first p-channel transistors; and comprising a second PMOS deck vertically offset from the first PMOS deck, with the second PMOS deck comprising second p-channel transistors; wherein:
   the NMOS deck is between the first and second PMOS decks; and
   said one or more circuit components of the CMOS tier include at least one circuit component having at least one n-channel transistor, at least one first p-channel transistor and at least one second p-channel transistor.

3. The assembly of claim 2 wherein the second p-channel transistors are substantially identical to the first p-channel transistors.

4. The assembly of claim 2 wherein the second p-channel transistors are not substantially identical to the first p-channel transistors.

5. The assembly of claim 1 wherein the NMOS deck is a first NMOS deck; wherein the n-channel transistors are first n-channel transistors; and comprising a second NMOS deck vertically offset from the first NMOS deck, with the second NMOS deck comprising second n-channel transistors; wherein:
   the PMOS deck is between the first and second NMOS decks; and
   said one or more circuit components of the CMOS tier include at least one circuit component having at least one p-channel transistor, at least one first n-channel transistor and at least one second n-channel transistor.

6. The assembly of claim 5 wherein the second n-channel transistors are substantially identical to the first n-channel transistors.

7. The assembly of claim 5 wherein the second n-channel transistors are not substantially identical to the first n-channel transistors.

8. The assembly of claim 1 comprising an integrated device tier vertically offset from the CMOS tier and having one or more structures coupled with at least one of the circuit components of the CMOS tier.

9. The assembly of claim 8 wherein the integrated device tier comprises sensors.

10. The assembly of claim 8 wherein the integrated device tier comprises memory.

11. The assembly of claim 8 wherein the integrated device tier is above the CMOS tier.

12. The assembly of claim 8 wherein the integrated device tier is below the CMOS tier.

13. The assembly of claim 1 comprising a first integrated device tier below the CMOS tier and a second integrated device tier above the CMOS tier; wherein the first integrated device tier has one or more structures coupled with a first of the circuit components of the CMOS tier; and wherein the second integrated device tier has one or more structures coupled with a second of the circuit components of the CMOS tier.

14. The assembly of claim 1 wherein said one or more circuit components of the CMOS tier include a transmission pass gate having a different number of the p-channel transistors than the n-channel transistors.

15. The assembly of claim 1 wherein said one or more circuit components of the CMOS tier include a two-input NAND circuit.

16. The assembly of claim 15 wherein the two-input NAND circuit comprises a same number of the p-channel transistors as the n-channel transistors.

17. The assembly of claim 15 wherein the two-input NAND circuit comprises a different number of the p-channel transistors than the n-channel transistors.

18. The assembly of claim 1 wherein said one or more circuit components of the CMOS tier include an inverter.

19. The assembly of claim 18 wherein the inverter comprises a same number of the p-channel transistors as the n-channel transistors.

20. The assembly of claim 18 wherein the inverter comprises a different number of the p-channel transistors than the n-channel transistors.

21. The assembly of claim 1 wherein one of the p-channel transistors is coupled to one of the n-channel transistors with a conductive interconnect that extends through the insulative region.

22. The assembly of claim 1 wherein the p-channel transistors and the n-channel transistors are thin-film transistors.

23. The assembly of claim 1 wherein two or more transistors comprised by either the PMOS deck or the NMOS deck are coupled to one another through a horizontal connection.

24. The assembly of claim 23 wherein the horizontal connection is within the insulative region between the PMOS deck and the NMOS deck.

25. The assembly of claim 24 wherein the horizontal connection is a combination of an interconnect and at least one horizontally-extending segment of conductive material adjacent the interconnect.

26. The assembly of claim 25 wherein the at least one horizontally-extending segment of conductive material includes a segment extending along a row direction.

27. The assembly of claim 25 wherein the at least one horizontally-extending segment of conductive material includes a segment extending along a column direction.

28. The assembly of claim 25 wherein the at least one horizontally-extending segment of conductive material includes a segment extending along a row direction, and includes a segment extending along a column direction.

29. An assembly comprising a CMOS tier, the CMOS tier comprising:
a first deck, the first deck comprising a plurality of first transistors which are substantially identical to one another;
a second deck above the first deck, the second deck comprising a plurality of second transistors which are substantially identical to one another;
a third deck above the second deck; the third deck comprising a plurality of third transistors which are substantially identical to one another;
a first insulative region between the first deck and the second deck;
a second insulative region between the second deck and the third deck;
the first and third decks comprising a first transistor type, and the second deck comprising a second transistor type; one of the first and second transistor types being a p-channel type, and the other of the first and second transistor types being an n-channel type;
one or more first conductive interconnects extending through the first insulative region to couple one or more of the second transistors with one or more of the first transistors, the first conductive interconnects including at least one vertically-extending conductive post extending through the first insulative region, and being in direct physical contact with a first source/drain region comprised by an individual of the transistors of the first transistor type and being in direct physical contact with a second source/drain comprised by an individual transistor of the second transistor type;
one or more second conductive interconnects extending through the second insulative region to couple one or more of the third transistors with one or more of the second transistors; and
the CMOS tier having one or more circuit components which include at least one second transistor and one or both of a first transistor and a third transistor.

30. The assembly of claim 29 wherein the first transistor type is the p-channel type.

31. The assembly of claim 29 wherein the first transistor type is the n-channel type.

32. The assembly of claim 29 wherein the first transistors are substantially identical to the third transistors.

33. The assembly of claim 29 wherein the first transistors are not substantially identical to the third transistors.

34. The assembly of claim 29 comprising an integrated device tier vertically offset from the CMOS tier and having one or more structures coupled with at least one of the circuit components of the CMOS tier.

35. The assembly of claim 34 wherein the integrated device tier is above the CMOS tier.

36. The assembly of claim 34 wherein the integrated device tier is below the CMOS tier.

37. The assembly of claim 29 wherein one of the first transistors is coupled to one of the third transistors with a conductive interconnect which passes through the second deck.

38. The assembly of claim 37 wherein a region of the conductive interconnect passing through the second deck is laterally surrounded by a first insulative material which directly contacts the region of the conductive interconnect; wherein the first insulative material is laterally surrounded by a second insulative material which directly contacts the first insulative material; and wherein the first and second insulative materials are different from one another.

* * * * *